(12) United States Patent
Kato

(10) Patent No.: US 9,019,168 B2
(45) Date of Patent: Apr. 28, 2015

(54) FREQUENCY STABILIZATION CIRCUIT, FREQUENCY STABILIZATION DEVICE, ANTENNA APPARATUS AND COMMUNICATION TERMINAL EQUIPMENT, AND IMPEDANCE CONVERSION ELEMENT

(75) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 604 days.

(21) Appl. No.: 13/361,100

(22) Filed: Jan. 30, 2012

(65) Prior Publication Data

US 2012/0127049 A1 May 24, 2012

Related U.S. Application Data

(63) Continuation of application No. PCT/JP2011/050816, filed on Jan. 19, 2011.

(30) Foreign Application Priority Data

| Jan. 19, 2010 | (JP) | ................................ | 2010-009513 |
| Apr. 21, 2010 | (JP) | ................................ | 2010-098312 |
| Apr. 21, 2010 | (JP) | ................................ | 2010-098313 |
| Jan. 19, 2011 | (JP) | ................................ | 2011-008354 |

(51) Int. Cl.
*H01Q 1/50* (2006.01)
*H01Q 9/00* (2006.01)
(Continued)

(52) U.S. Cl.
CPC ............ *H01Q 1/243* (2013.01); *H01P 1/20345* (2013.01); *H03H 7/38* (2013.01);
(Continued)

(58) Field of Classification Search
None
See application file for complete search history.

(56) References Cited

U.S. PATENT DOCUMENTS 7,969,270 B2 * 6/2011 Berke et al. .................... 336/182
7,990,337 B2 * 8/2011 Kato et al. ..................... 343/895
(Continued)

FOREIGN PATENT DOCUMENTS

| JP | 2000-124728 A | 4/2000 |
| JP | 2000-244273 A | 9/2000 |

(Continued)

OTHER PUBLICATIONS

Shigeru Hatada, A Hybrid Circuit and Transformer, Sep. 8, 2000, Machine Translation from Japanese to English of JP 2000-244273.*

(Continued)

*Primary Examiner* — Hoang V Nguyen
*Assistant Examiner* — Patrick Holecek
(74) *Attorney, Agent, or Firm* — Keating & Bennett, LLP

(57) ABSTRACT

A frequency stabilization device includes a first radiating element, a second radiating element, a feeding circuit connected to the first and second radiating elements, and a frequency stabilization circuit disposed between the feeding circuit and the first radiating element. The frequency stabilization circuit includes a primary-side series circuit connected to the feeding circuit and a secondary-side series circuit coupled to the primary-side series circuit via an electric field or a magnetic field. A first inductance element and a second inductance element are connected in series to each other, and a third inductance element and a fourth inductance element are connected in series to each other. The first and third inductance elements are coupled to each other, and the second and fourth inductance elements are coupled to each other.

25 Claims, 30 Drawing Sheets

(51) Int. Cl.
*H01Q 1/24* (2006.01)
*H01P 1/203* (2006.01)
*H03H 7/38* (2006.01)
*H04B 1/04* (2006.01)
*H03H 7/09* (2006.01)
*H03H 7/40* (2006.01)
*H03H 7/46* (2006.01)
*H03H 7/01* (2006.01)

(52) U.S. Cl.
CPC .............. *H04B 1/0458* (2013.01); *H03H 7/09* (2013.01); *H03H 7/40* (2013.01); *H03H 7/468* (2013.01); *H03H 7/1775* (2013.01); *H01Q 5/371* (2015.01)

(56) References Cited

U.S. PATENT DOCUMENTS

| | | |
|---|---|---|
| 2004/0217915 A1 | 11/2004 | Imaizumi |
| 2009/0167455 A1 | 7/2009 | Liu et al. |
| 2010/0194498 A1 | 8/2010 | Isoshima |
| 2010/0259344 A1 | 10/2010 | Nosaka |

FOREIGN PATENT DOCUMENTS

| | | |
|---|---|---|
| JP | 2004-172919 A | 6/2004 |
| JP | 2004-304615 A | 10/2004 |
| JP | 2004-336250 A | 11/2004 |
| JP | 2005-6096 A | 1/2005 |
| JP | 2005-323132 A | 11/2005 |
| JP | 2006-173697 A | 6/2006 |
| JP | 2008-35065 A | 2/2008 |
| JP | 2008-118359 A | 5/2008 |
| JP | 2009-246624 A | 10/2009 |
| WO | 2009/054203 A1 | 4/2009 |
| WO | 2009/090917 A1 | 7/2009 |

OTHER PUBLICATIONS

Official Communication issued in International Patent Application No. PCT/JP2011/050816, mailed on Apr. 26, 2011.

Official Communication issued in corresponding European Patent Application No. 11734654.4, mailed on Apr. 3, 2013.

* cited by examiner

US 9,019,168 B2

FREQUENCY STABILIZATION CIRCUIT, FREQUENCY STABILIZATION DEVICE, ANTENNA APPARATUS AND COMMUNICATION TERMINAL EQUIPMENT, AND IMPEDANCE CONVERSION ELEMENT

BACKGROUND OF THE INVENTION

1. Field of the Invention

The present invention relates to frequency stabilization circuits, frequency stabilization devices, antenna apparatuses and communication terminal equipment, and impedance conversion elements, and, more particularly, to an antenna apparatus installed in communication terminal equipment such as a mobile telephone, a frequency stabilization circuit included in the antenna apparatus, a frequency stabilization device and a communication terminal equipment including the antenna apparatus, and an impedance conversion element.

2. Description of the Related Art

In recent years, as an antenna apparatus installed in a mobile communication terminal, a casing dipole antenna that includes a metal body (for example, the ground plate of a printed circuit board) in a terminal casing as a radiating element has been proposed in Japanese Unexamined Patent Application Publication No. 2004-172919, Japanese Unexamined Patent Application Publication No. 2005-6096, and Japanese Unexamined Patent Application Publication No. 2008-118359. This kind of casing dipole antenna can have performance similar to that of a dipole antenna by performing differential feeding on two casing ground plates (a ground plate in the casing of a body portion and a ground plate in the casing of a cover portion) in a folding-type or slide-type mobile telephone. Since a ground plate in a casing is used as a radiating element, there is no need to provide a dedicated radiating element and the size reduction of a mobile communication terminal can be achieved.

However, in the above-described casing dipole antenna, the impedance of a ground plate used as a radiating element is changed in accordance with the shapes of the ground plate and a casing and the position of an adjacent metal body (a closely disposed electronic component or hinge component). Accordingly, in order to minimize the energy loss of a high-frequency signal, it is necessary to design an impedance matching circuit for each model. In folding-type and slide-type mobile communication terminals, the impedances of a ground plate and an impedance matching circuit are changed in accordance with the positional relationship between the casing of a main portion and the casing of a cover portion (for example, in the case of a folding-type mobile communication terminal, the closed/open state of a cover portion). Accordingly, a control circuit for controlling impedance is sometimes needed.

SUMMARY OF THE INVENTION

Preferred embodiments of the present invention provide a frequency stabilization circuit, a frequency stabilization device, an antenna apparatus, and communication terminal equipment which are capable of stabilizing the frequency of a high-frequency signal regardless of the shapes of a radiating element and a casing and the position of an adjacent component. Also, preferred embodiments of the present invention provide an impedance conversion element that has a very small insertion loss.

A frequency stabilization circuit according to a first preferred embodiment of the present invention includes a primary-side series circuit that includes a first reactance element and a second reactance element connected in series to the first reactance element, and is connected to a feeding circuit and a secondary-side series circuit that includes a third reactance element coupled to the first reactance element and a fourth reactance element connected in series to the third reactance element and coupled to the second reactance element, and is connected to a radiating element.

An antenna apparatus according to a second preferred embodiment of the present invention includes a frequency stabilization circuit and a radiating element. The frequency stabilization circuit includes a primary-side series circuit that includes a first reactance element and a second reactance element connected in series to the first reactance element, and is connected to a feeding circuit and a secondary-side series circuit that includes a third reactance element coupled to the first reactance element and a fourth reactance element connected in series to the third reactance element and coupled to the second reactance element. The radiating element is connected to the secondary-side series circuit.

Communication terminal equipment according to a third preferred embodiment of the present invention includes a frequency stabilization circuit, a feeding circuit, and a radiating element. The frequency stabilization circuit includes a primary-side series circuit that includes a first reactance element and a second reactance element connected in series to the first reactance element and a secondary-side series circuit that includes a third reactance element coupled to the first reactance element and a fourth reactance element connected in series to the third reactance element and coupled to the second reactance element. The feeding circuit is connected to the primary-side series circuit. The radiating element is connected to the secondary-side series circuit.

A frequency stabilization device according to a fourth preferred embodiment of the present invention includes a laminate including a plurality of dielectric layers or magnetic layers laminated on each other, a primary-side series circuit that is disposed at or in the laminate, includes a first reactance element and a second reactance element connected in series to the first reactance element, and is connected to a feeding circuit, and a secondary-side series circuit that is disposed at or in the laminate, includes a third reactance element coupled to the first reactance element and a fourth reactance element connected in series to the third reactance element and coupled to the second reactance element, and is connected to a radiating element.

In the frequency stabilization circuit and the frequency stabilization device, a high degree of electromagnetic field coupling or magnetic field coupling between the primary-side and secondary-side series circuits is achieved using a magnetic flux. The primary-side series circuit performs impedance matching with the side of the feeding circuit, and the secondary-side series circuit performs impedance matching with the side of the radiating element. Accordingly, the frequency of a transmission/receiving signal is stabilized. In addition, good transmission efficiency of high-frequency signal energy is obtained, and the frequency of a high-frequency signal is stabilized without being affected by the shapes of the radiating element and a casing and the position of an adjacent component.

In the frequency stabilization device, the first and third reactance elements are disposed on the same layer in the laminate, and the second and fourth reactance elements are disposed on the same layer in the laminate. Accordingly, the thickness of the laminate (the frequency stabilization device) is reduced. Since the first and third reactance elements coupled to each other and the second and fourth reactance elements coupled to each other can be formed in the same process, the variations in the coupling degree caused by misalignment between lamination layers is prevented and suppressed and reliability is improved.

An impedance conversion element according to a fifth preferred embodiment includes a primary-side series circuit including a first coil element and a second coil element connected in series to the first coil element and a secondary-side series circuit including a third coil element coupled to the first coil element and a fourth coil element connected in series to the third coil element and coupled to the second coil element.

In the impedance conversion element, since a high degree of electromagnetic field coupling or magnetic field coupling between the primary-side and secondary-side series circuits is achieved using a magnetic flux, an insertion loss is reduced. In addition, since coupling between coil elements (in particular, coupling between closed magnetic circuits) is used, impedance conversion from the primary side to the secondary side can be arbitrarily performed.

According to various preferred embodiments of the present invention, the frequency of a high-frequency signal can be stabilized regardless of the shapes of a radiating element and a casing and the position of an adjacent component. In addition, an impedance conversion element with a small insertion loss can be obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A and 1B are schematic diagrams illustrating a mobile communication terminal including an antenna apparatus, wherein FIG. 1A illustrates a first example of the mobile communication terminal and FIG. 1B illustrates a second example of the mobile communication terminal.

FIGS. 2A-2C are diagrams illustrating an antenna apparatus according to a first preferred embodiment of the present invention, wherein FIG. 2A is an equivalent circuit diagram of the antenna apparatus, FIG. 2B is an operation principle diagram of the antenna apparatus, and FIG. 2C is a circuit diagram of the antenna apparatus illustrated from the viewpoint of a filter.

FIGS. 4A and 4B are diagrams illustrating a frequency stabilization circuit in the form of a laminate, wherein FIG. 4A is a perspective view of the frequency stabilization circuit on the side of a top surface and FIG. 4B is a perspective view of the frequency stabilization circuit on the side of an undersurface.

FIGS. 16A and 16B are diagrams illustrating a first example of a frequency stabilization device, wherein FIG. 16A is a perspective view of the frequency stabilization device on the side of a top surface and FIG. 16B is a perspective view of the frequency stabilization device on the side of an undersurface.

FIGS. 28A and 28B are diagrams illustrating an impedance conversion element according to a tenth preferred embodiment of the present invention, wherein FIG. 28A is an equivalent circuit diagram of the impedance conversion element and FIG. 28B is an operation principle diagram of the impedance conversion element.

FIGS. 31A and 31B are diagrams illustrating an impedance conversion element according to the tenth preferred embodiment in the form of a laminate, wherein FIG. 31A is a perspective view of the impedance conversion element on the side of a top surface and FIG. 31B is a perspective view of the impedance conversion element on the side of an undersurface.

DETAILED DESCRIPTION OF THE PREFERRED EMBODIMENTS

Figure 1A:
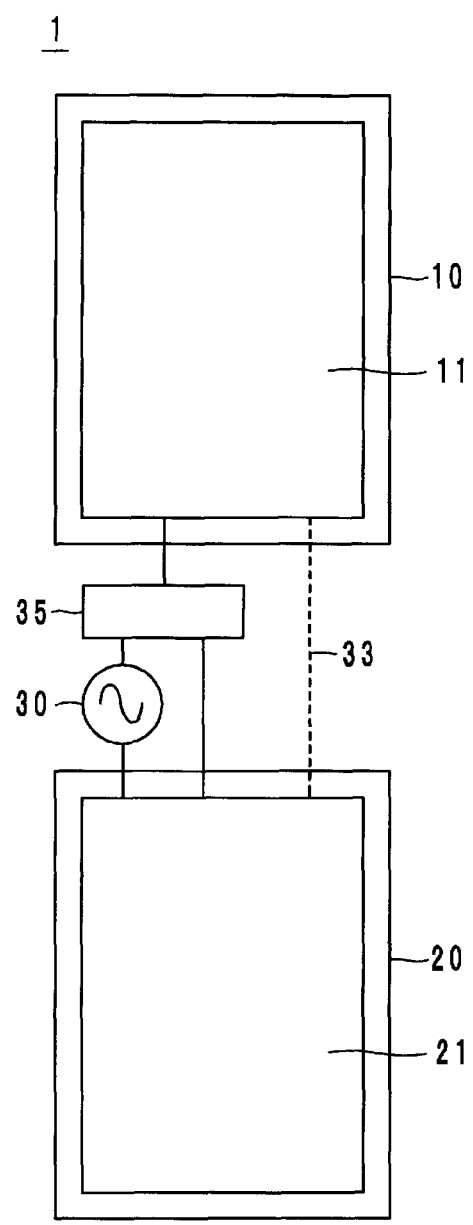

A frequency stabilization circuit, an antenna apparatus and communication terminal equipment, and an impedance conversion element according to a preferred embodiment of the present invention will be described below with reference to the accompanying drawings. In the drawings, the same reference numeral is used to represent the same component or the same element so as to avoid repetitious explanation.

Figure 1B:
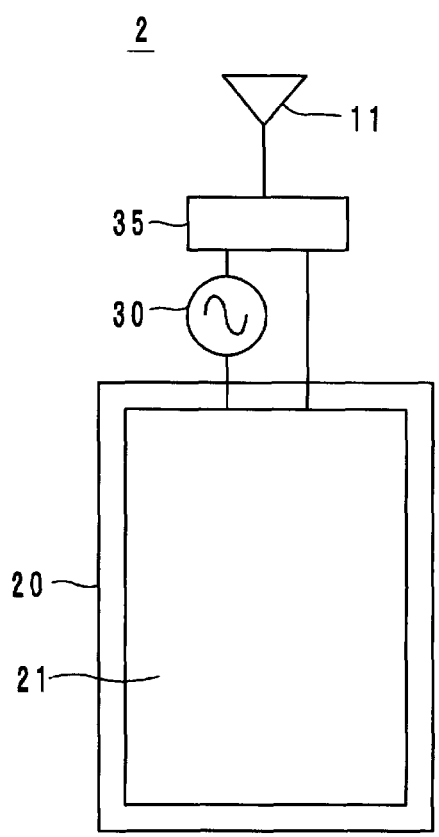

A mobile communication terminal 1 according to a first example is illustrated in FIG. 1A, and a mobile communication terminal 2 according to a second example is illustrated in FIG. 1B. These terminals 1 and 2 are terminals preferably for use in receiving a high-frequency signal in the range of about 470 MHz to about 770 MHz in the one-segment partial reception service (called One seg) for mobile telephones and mobile terminals, for example.

As illustrated in FIG. 1A, the mobile communication terminal 1 includes a first casing 10 that is a cover portion and a second casing 20 that is a main portion. The first casing 10 is coupled to the second casing 20 so that the first casing 10 is foldable or slidable. A first radiating element 11 and a second radiating element 21 that also function as ground plates are disposed at or in the first casing 10 and the second casing 20, respectively. The first and second radiating elements 11 and 21 are preferably made of a conductive film that is a thin film such as a metal foil or a thick film made of conductive paste, for example. The first radiating element 11 and the second radiating element 21 are subjected to differential feeding from a feeding circuit 30, so that they have performance similar to that of a dipole antenna. The feeding circuit 30 includes a signal processing circuit such as an RF circuit or a baseband circuit.

As illustrated in FIG. 1B, in the mobile communication terminal 2, the first radiating element 11 is disposed as an antenna. The first radiating element 11 may use various antenna elements such as a chip antenna, a sheet-metal antenna, and a coil antenna. Alternatively, for example, as this antenna element, a linear conductor disposed along an inner peripheral surface or an outer peripheral surface of the casing 10 may be used. The second radiating element 21 also functions as a ground plate for the second casing 20, and may use various antennas like the first radiating element 11. Here, the mobile communication terminal 2 preferably is not of a folding or sliding type but of a straight type. The second radiating element 21 may not function as a radiator, and the first radiating element 11 may operate as a so-called monopole antenna.

One end of the feeding circuit 30 is connected to the second radiating element 21, and the other end thereof is connected to the first radiating element 11 via a frequency stabilization circuit 35. The first and second radiating elements 11 and 21 are connected to each other by a connection line 33. The connection line 33 connects electronic components (not illustrated) in the first and second casings 10 and 20. The connection line 33 function as an inductance element for a high-frequency signal, but has no direct impact on the performance of an antenna.

The frequency stabilization circuit 35 is disposed between the feeding circuit 30 and the first radiating element 11, and stabilizes the frequency characteristic of a high-frequency signal transmitted from or received by the first and second radiating elements 11 and 21. Accordingly, the frequency characteristic of a high-frequency signal is stabilized regardless of the shapes of the first and second radiating elements 11 and 21 and the first and second casings 10 and 20 and the positions of adjacent components. In particular, in the case of a folding-type or sliding-type mobile communication terminal, the impedances of the first and second radiating elements 11 and 21 are easily changed in accordance with the open/closed state of the first casing 10, which is a cover portion, with respect to the second casing 20, which is a main portion. However, by using the frequency stabilization circuit 35, the frequency characteristic of a high-frequency signal can be stabilized. That is, the frequency stabilization circuit 35 can have a frequency characteristic adjustment function to adjust the settings of a center frequency, a passband width, and impedance matching which are important for the design of an antenna. The design of an antenna can be therefore easily performed in consideration of only the directivity and gain of an antenna element. The frequency stabilization circuit will be described in detail below in the form of first to sixth preferred embodiments.

First Preferred Embodiment

Figure 2A:
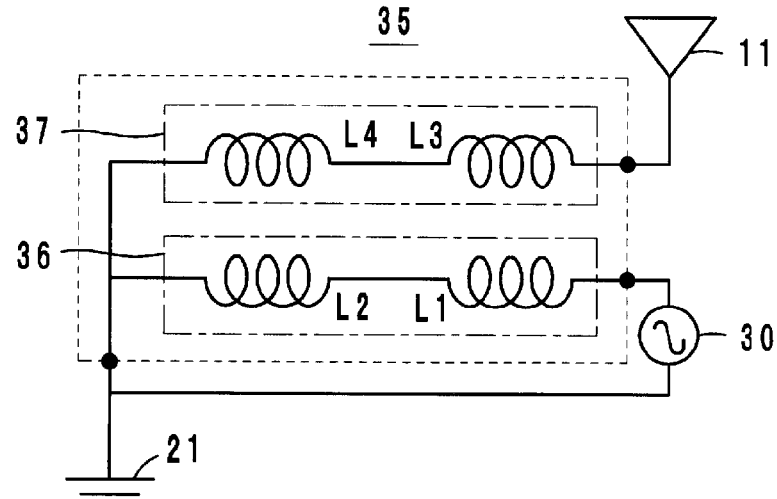

As illustrated in FIG. 2A, the frequency stabilization circuit 35 (hereinafter also referred to as a stabilizer circuit) included in an antenna apparatus according to the first preferred embodiment includes a primary-side reactance circuit connected to the feeding circuit 30 and a secondary-side reactance circuit connected to the primary-side reactance circuit via an electric field or a magnetic field. The primary-side reactance circuit includes a primary-side series circuit 36 including a first reactance element and a second reactance element connected in series to the first reactance element. The secondary-side reactance circuit includes a secondary-side series circuit 37 including a third reactance element coupled to the first reactance element and a fourth reactance element that is connected in series to the third reactance element and is coupled to the second reactance element. More specifically, the first, second, third, and fourth reactance elements are a first inductance element L1, a second inductance element L2, a third inductance element L3, and a fourth inductance element L4, respectively.

One end of the primary-side series circuit 36 (one end of the first inductance element L1) is connected to the feeding circuit 30, and one end of the secondary-side series circuit 37 (one end of the third inductance element L3) is connected to the first radiating element 11. The other end of the primary-side series circuit 36 (the other end of the second inductance element L2) and the other end of the secondary-side series circuit 37 (the other end of the fourth inductance element L4) are connected to the second radiating element 21.

Figure 2B:
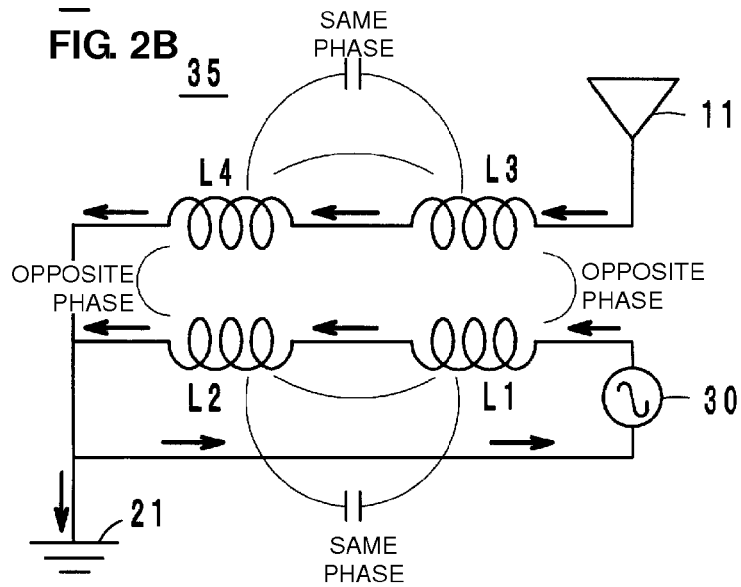

As illustrated in FIG. 2B, the first and second inductance elements L1 and L2 are coupled to each other via a magnetic field and an electric field in the same phase, and the third and fourth inductance elements L3 and L4 are coupled to each other via a magnetic field and an electric field in the same phase. That is, pattern wiring is arranged so that a closed magnetic circuit is defined by the first and second inductance elements L1 and L2, the first and second inductance elements L1 and L2 are coupled to each other mainly via an electromagnetic field, and a current generated by magnetic field coupling and a current generated by electric field coupling flow in the same direction. Furthermore, pattern wiring is performed so that a closed magnetic circuit is defined by the third and fourth inductance elements L3 and L4, the third and fourth inductance elements L3 and L4 are coupled to each other mainly via an electromagnetic field, and a current generated by magnetic field coupling and a current generated by electric field coupling flow in the same direction. Still furthermore, pattern wiring is arranged so that the first and third inductance elements L1 and L3 are coupled to each other in opposite phases and a current generated by magnetic field coupling and a current generated by electric field coupling flow in the same direction. Similarly, pattern wiring is arranged so that the second and fourth inductance elements L2 and L4 are coupled to each other in opposite phases and a current generated by magnetic field coupling and a current generated by electric field coupling flow in the same direction. That is, the closed magnetic circuit defined by the first and third inductance elements L1 and L3 and the closed magnetic circuit defined by the second and fourth inductance elements L2 and L4, i.e., the primary-side and secondary-side series circuits 36 and 37, are coupled mainly via an electromagnetic field, and a current generated by electric field coupling and a current generated by magnetic field coupling flow in the same direction. Accordingly, electromagnetic field coupling stronger than coupling only via a magnetic field or an electric field is obtained. Here, "coupling via an electromagnetic field" means coupling via an electric field, coupling via a magnetic field, or coupling via both an electric field and a magnetic field.

In the frequency stabilization circuit 35 having the above-described configuration, a high-frequency signal current that has flowed from the feeding circuit 30 to the primary-side series circuit 36 is led to the first inductance element L1. When each inductance element is defined by a coil pattern, the high-frequency signal current is led to the third inductance element L3 via an induction field as a secondary current. The high-frequency signal current that has been led to the second inductance element L2 is led to the fourth inductance element L4 via an induction field as a secondary current. As a result, the high-frequency signal current flows in a direction represented by arrows in FIG. 2B.

That is, in the primary-side series circuit 36, when a current flows through the first and second inductance elements L1 and L2, a closed magnetic circuit is formed between the inductance elements L1 and L2 since the first and second inductance elements L1 and L2 are connected in series to each other in the same phase. Similarly, in the secondary-side series circuit 37, when the closed magnetic circuit generated at the primary-side series circuit 36 flows an induction current through the third and fourth inductance elements L3 and L4, a closed magnetic circuit is formed between the inductance elements L3 and L4 since the third and fourth inductance elements L3 and L4 are connected in series to each other in the same phase.

As described previously, since the first and second inductance elements L1 and L2 define a closed magnetic circuit and are coupled to each other in the same phase, the total inductance value of the primary-side series circuit 36 becomes smaller than an inductance value obtained by simply adding the inductance values of the first and second inductance elements L1 and L2. On the other hand, the first and third inductance elements L1 and L3 are coupled to each other via a mutual inductance, and the value of the mutual inductance is an inductance value obtained by adding the inductance values of the first and third inductance elements L1 and L3. The relationship between the second and fourth inductance elements L2 and L4 is the same as that between the first and third inductance elements L1 and L3.

That is, since the total value of mutual inductances between the primary-side and secondary-side series circuits 36 and 37 is relatively larger than the inductance value of the primary-side series circuit 36 or the secondary-side series circuit 37, the degree of coupling between the primary-side and secondary-side series circuits 36 and 37 becomes apparently high. That is, since magnetic fields at the primary-side and secondary-side series circuits 36 and 37 individually define closed magnetic circuits, the total inductance value ($=L1+L2-M_{L1L2}$) of the primary-side series circuit 36 and the total inductance value ($=L3+L4-M_{L3L4}$) of the secondary-side series circuit 37 are obtained and a current having the same direction as that of a current canceling a magnetic field generated at the primary-side series circuit 36 (for example, a displacement current) flows through the secondary-side series circuit 37. Accordingly, little power is leaked at the primary-side and secondary-side series circuits 36 and 37 and the total mutual inductance value ($=M_{L1L3}+M_{L2L4}$) of the primary-side and secondary-side series circuits 36 and 37 becomes larger than the total inductance value ($=L1+L2-M_{L1L2}$) of the series circuit 36 and the total inductance value ($=L3+L4-M_{L3L4}$) of the series circuit 37. The degree of coupling between the primary-side and secondary-side series circuits 36 and 37 is therefore increased. As a result, a high degree of coupling between the primary-side and secondary-side series circuits 36 and 37 equal to or greater than about 0.7, and sometimes greater than about 1.0 (about 2.0 in accordance with a frequency), for example, can be obtained.

In the frequency stabilization circuit 35, since the primary-side series circuit 36 performs impedance matching with the feeding circuit 30 and the secondary-side series circuit 37 performs impedance matching with the first radiating element 11, that is, the impedances of the primary-side and secondary-side series circuits 36 and 37 can be separately determined, impedance matching can be easily performed.

Figure 2C:
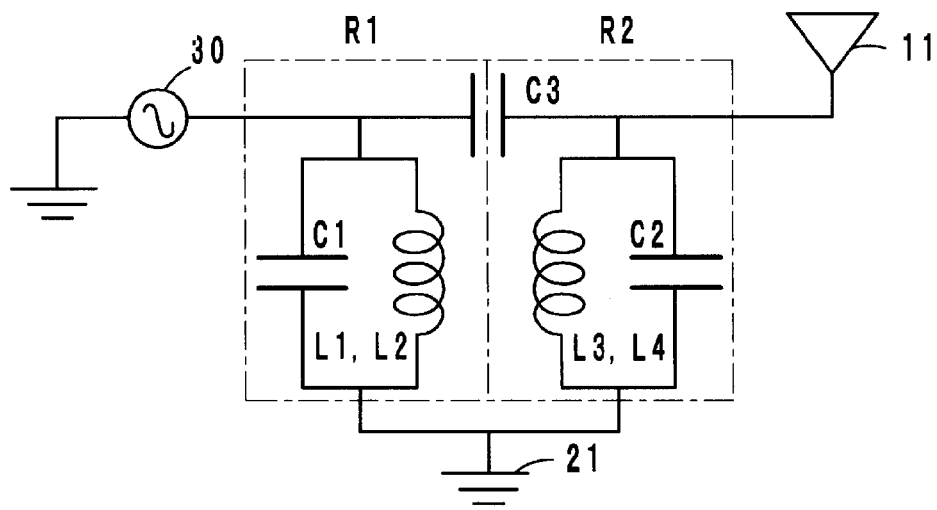

When the equivalent circuit in FIG. 2B is illustrated from the viewpoint of a filter, the circuit in FIG. 2C is obtained. A capacitance element C1 is a line capacitor defined by the first and second inductance elements L1 and L2, and a capacitance element C2 is a line capacitor defined by the third and fourth inductance elements L3 and L4. A capacitance element C3 is a line capacitor (parasitic capacitor) defined by the primary-side and secondary-side series circuits 36 and 37. That is, an LC parallel resonant circuit R1 is provided in the primary-side series circuit 36, and an LC parallel resonant circuit R2 is provided in the secondary-side series circuit 37.

Figure 3A:
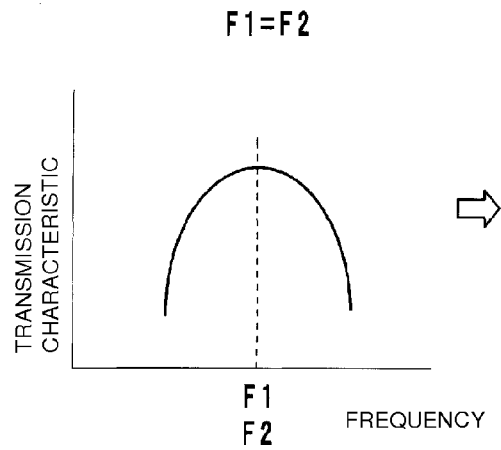
FIGS. 3A to 3D are graphs illustrating transmission characteristics of an antenna apparatus according to the first preferred embodiment of the present invention.
Figure 3B:
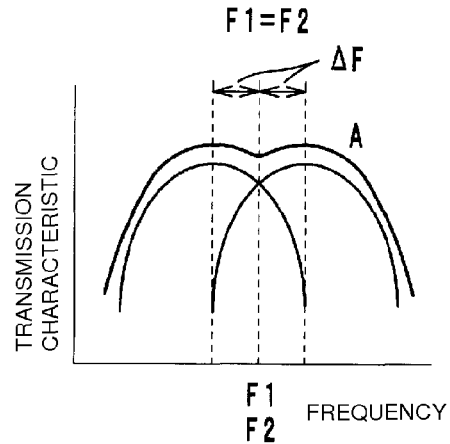

Assuming that the resonant frequencies of the LC parallel resonant circuits R1 and R2 are F1 and F2, respectively, and F1=F2 is satisfied, the transmission characteristic of a high-frequency signal from the feeding circuit 30 is as illustrated in FIG. 3A. By achieving coupling between the first and second inductance elements L1 and L2 and coupling between the third and fourth inductance elements L3 and L4 in opposite phases, the values of L1+L2 and L3+L4 become small. Accordingly, even if the inductance values of the inductance elements L1 to L4 are increased, the resonant frequencies are not reduced. The inductance values of the inductance elements L1 to L4 can be therefore increased, and a wide transmission characteristic can be obtained. As illustrated in FIG. 3B, a high-frequency signal from the first radiating element 11 obtains a wide transmission characteristic represented by a curve A. This mechanism is not completely understood, but it is presumed that coupling between the LC parallel resonant circuits R1 and R2 breaks degeneracy. ΔF is determined in accordance with the degree of coupling between the LC parallel resonant circuits R1 and R2. That is, the passband can be broadened in proportion to the coupling degree.

Figure 3C:
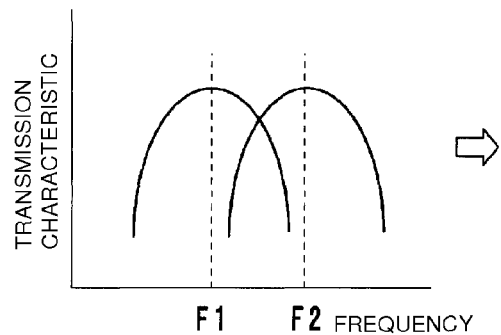
Figure 3D:
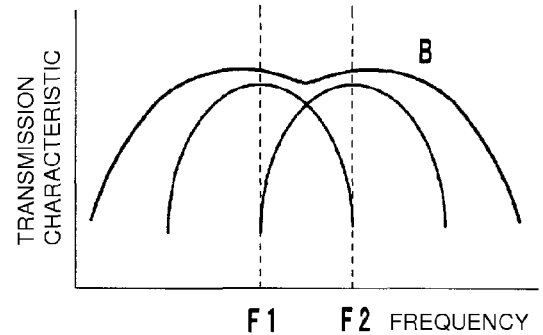

On the other hand, assuming that F1≠F2 is satisfied, the transmission characteristic of a high-frequency signal from the feeding circuit 30 is as illustrated in FIG. 3C. As illustrated in FIG. 3D, a high-frequency signal from the first radiating element 11 obtains a wide transmission characteristic represented by a curve B. It is also presumed that coupling between the LC parallel resonant circuits R1 and R2 breaks degeneracy. The higher the degree of coupling between the LC parallel resonant circuits R1 and R2, the wider the transmission characteristic.

Thus, since a frequency characteristic such as impedance matching is determined using a resonance characteristic possessed by the frequency stabilization circuit 35, a frequency shift rarely occurs. With a wide transmission characteristic, a passband can be ensured even if an impedance is changed. That is, it is possible to stabilize the frequency characteristic of a high-frequency signal to be received/transmitted regardless of the size and shape of a radiating element or an environment around the radiating element. Since a closed magnetic circuit is defined in the frequency stabilization circuit 35, a shield pattern may be disposed above and below a resonant circuit. In this case, a characteristic change caused by an external environment is further reduced.

Figure 4A:
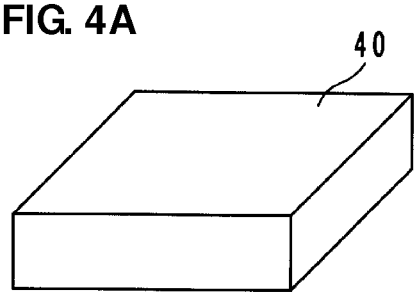
Figure 4B:
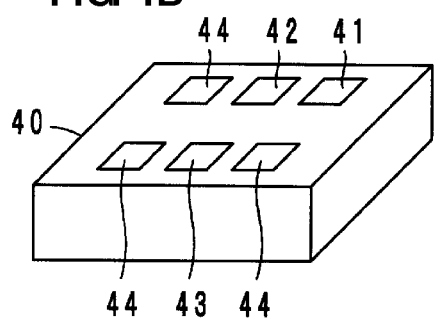

The frequency stabilization circuit 35 can be formed as a chip laminate 40, for example, illustrated in FIGS. 4A and 4B. The chip laminate 40 is obtained preferably by laminating a plurality of base material layers made of a dielectric or a magnetic substance. On the undersurface of the chip laminate 40, a feeding terminal 41 connected to the feeding circuit 30, a ground terminal 42 connected to the second radiating element 21, and an antenna terminal 43 connected to the first radiating element 11 are disposed. On the undersurface, NC terminals 44 used for mounting are also disposed. On the top surface of the laminate 40, a chip inductor or a chip capacitor used for impedance matching may be disposed as appropriate. In this case, various input/output impedances can be handled only by changing a disposed inductor or conductor. Alternatively, using an electrode pattern, an inductance element or a capacitor element may be provided in the chip laminate 40.

A first example of the frequency stabilization circuit 35 in the chip laminate 40 will be described with reference to FIG. 5. In this first example, a conductor 61 is disposed on a base material layer 51a that is the uppermost layer, a conductor 62 to be the first and second inductance elements L1 and L2 is disposed on a base material layer 51b that is the second layer, and two conductors 63 and 64 to be the first and second inductance elements L1 and L2 are disposed on a base material layer 51c that is the third layer. Two conductors 65 and 66 to be the third and fourth inductance elements L3 and L4 are disposed on a base material layer 51d that is the fourth layer, and a conductor 67 to be the third and fourth inductance elements L3 and L4 is disposed on a base material layer 51e that is the fifth layer. A ground conductor 68 is disposed on a base material layer 51f that is the sixth layer, and the feeding terminal 41, the ground terminal 42, and the antenna terminal 43 are disposed on the undersurface of a base material layer 51g that is the seventh layer. A plain base material layer (not illustrated) is laminated on the base material layer 51a that is the uppermost layer.

The conductors 61 to 68 can be mainly composed of a conductive material such as silver or copper, for example. In order to form the base material layers 51a to 51g with a dielectric, a glass-ceramic material or an epoxy resin material can be used, for example. In order to form the base material layers 51a to 51g with a magnetic substance, a ferrite ceramic material or a resin material containing ferrite can be used, for example. It is desired that as a material for a base material layer, a dielectric material be used when a UHF frequency stabilization circuit is provided and a magnetic substance material be used when an HF frequency stabilization circuit is provided.

By laminating the base material layers 51a to 51g, the conductors 61 to 68 and the terminals 41, 42, and 43 are connected via interlayer connection conductors (via-hole conductors) and the equivalent circuit illustrated in FIG. 2A is provided.

That is, the feeding terminal 41 is connected to one end of the coil pattern 63 via a via-hole conductor 45a, the conductor 61, and a via-hole conductor 45b, and the other end of the coil pattern 63 is connected to one end of a coil pattern 62a via a via-hole conductor 45c. The other end of the coil pattern 62a is connected to one end of a coil pattern 62b, and the other end of the coil pattern 62b is connected to one end of the coil pattern 64 via a via-hole conductor 45d. The other end of the coil pattern 64 is connected to the ground conductor 68 via a via-hole conductor 45e, and the ground conductor 68 is connected to the ground terminal 42 via a via-hole conductor 45f. That is, the coil patterns 63 and 62a define a first coil pattern, i.e., the first inductance element L1, and the coil patterns 62b and 64 define a second coil pattern, i.e., the second inductance element L2.

The antenna terminal 43 is connected to one end of the coil pattern 65 via a via-hole conductor 45g, and the other end of the coil pattern 65 is connected to one end of a coil pattern 67a via a via-hole conductor 45h. The other end of the coil pattern 67a is connected to one end of a coil pattern 67b, and the other end of the coil pattern 67b is connected to one end of the coil pattern 66 via a via-hole conductor 45i. The other end of the coil pattern 66 is connected to the ground conductor 68 via a via-hole conductor 45j, and the ground conductor 68 is connected to the ground terminal 42 via the via-hole conductor 45f. That is, the coil patterns 65 and 67a define a third coil pattern, i.e., the third inductance element L3, and the coil patterns 67b and 66 define a fourth coil pattern, i.e., the fourth inductance element L4.

Figure 5:
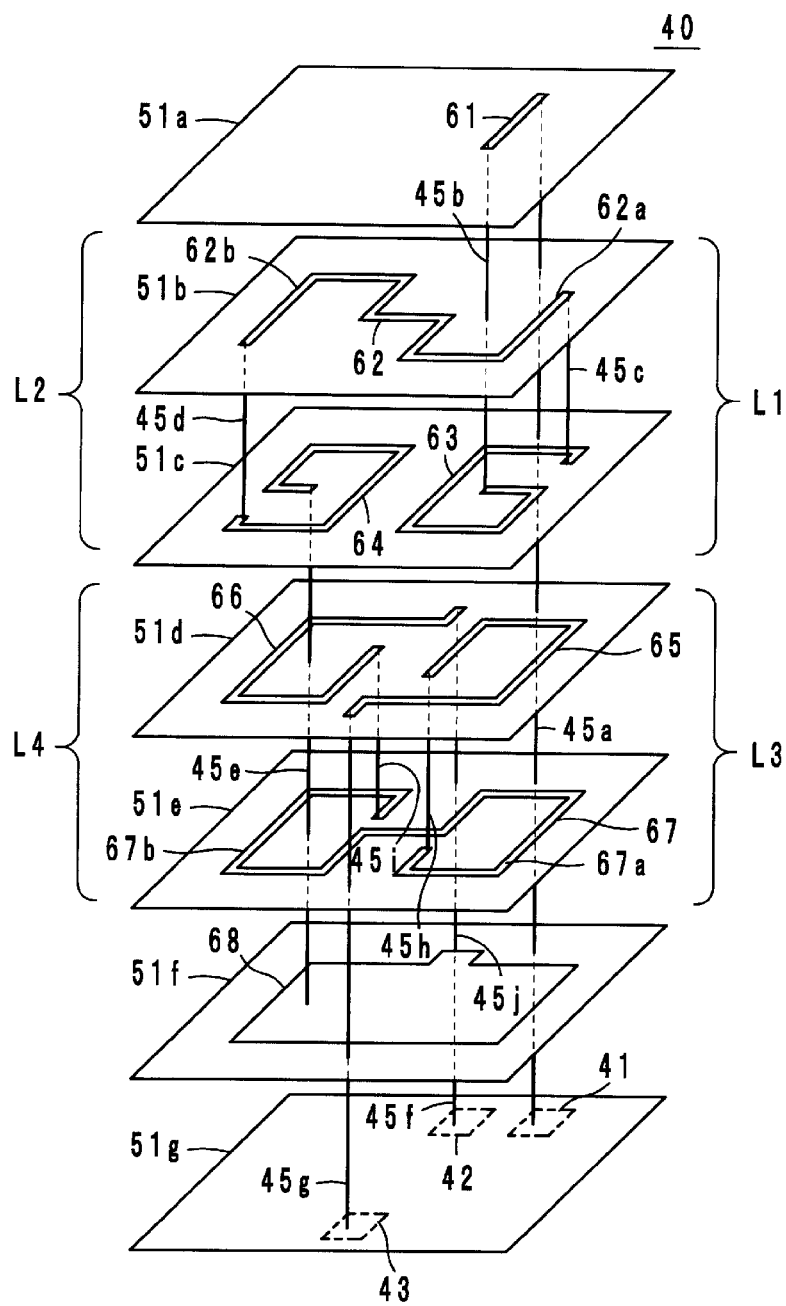
FIG. 5 is an exploded perspective view of a first example of a frequency stabilization circuit in the form of a laminate.

As illustrated in FIG. 5, the first and second coil patterns are adjacent to each other so that the winding axes of the first and second coil patterns are parallel or substantially parallel to each other, and the third and fourth coil patterns are adjacent to each other so that the winding axes of the third and fourth coil patterns are parallel or substantially parallel to each other. Furthermore, the first and third coil patterns are disposed so that the winding axes of the first and third coil patterns are on substantially the same line, and the second and fourth coil patterns are disposed so that the winding axes of the second and fourth coil patterns are on substantially the same line.

Each coil pattern is preferably defined by a one-turn loop conductor, but may be defined by a loop conductor having a plurality of turns. The first and third coil patterns may not be disposed so that the winding axes thereof are on exactly the same line, and may be wound so that the coil openings of the first and third coil patterns overlap in plan view, that is, a common magnetic flux passes through these coil patterns. Similarly, the second and fourth coil patterns may not be disposed so that the winding axes thereof are on exactly the same line, and may be wound so that the coil openings of the second and fourth coil patterns overlap in plan view, that is, a common magnetic flux passes through these coil patterns.

As described previously, by disposing the inductance elements L1 to L4 in the laminate 40 formed of a dielectric or a magnetic substance, and, in particular, disposing a portion of coupling between the primary-side and secondary-side series circuits 36 and 37 in the laminate 40, the values of elements included in the frequency stabilization circuit 35 and the degree of coupling between the primary-side and secondary-side series circuits 36 and 37 are not easily affected by an electronic element disposed near the laminate 40. As a result, it is possible to further stabilize a frequency characteristic.

Since various wiring lines are disposed on a printed circuit board (not illustrated) on which the laminate 40 is mounted, there is a possibility that these wiring lines and the frequency stabilization circuit 35 interfere with each other. By disposing the ground conductor 68 at the bottom of the laminate 40 so that the ground conductor 68 covers openings of coil patterns defined by the conductors 61 to 67, a magnetic field generated by the coil patterns are not easily affected by magnetic fields from these wiring lines. That is, variations in the L values of the inductance elements L1 to L4 are not easily made.

Figure 6:
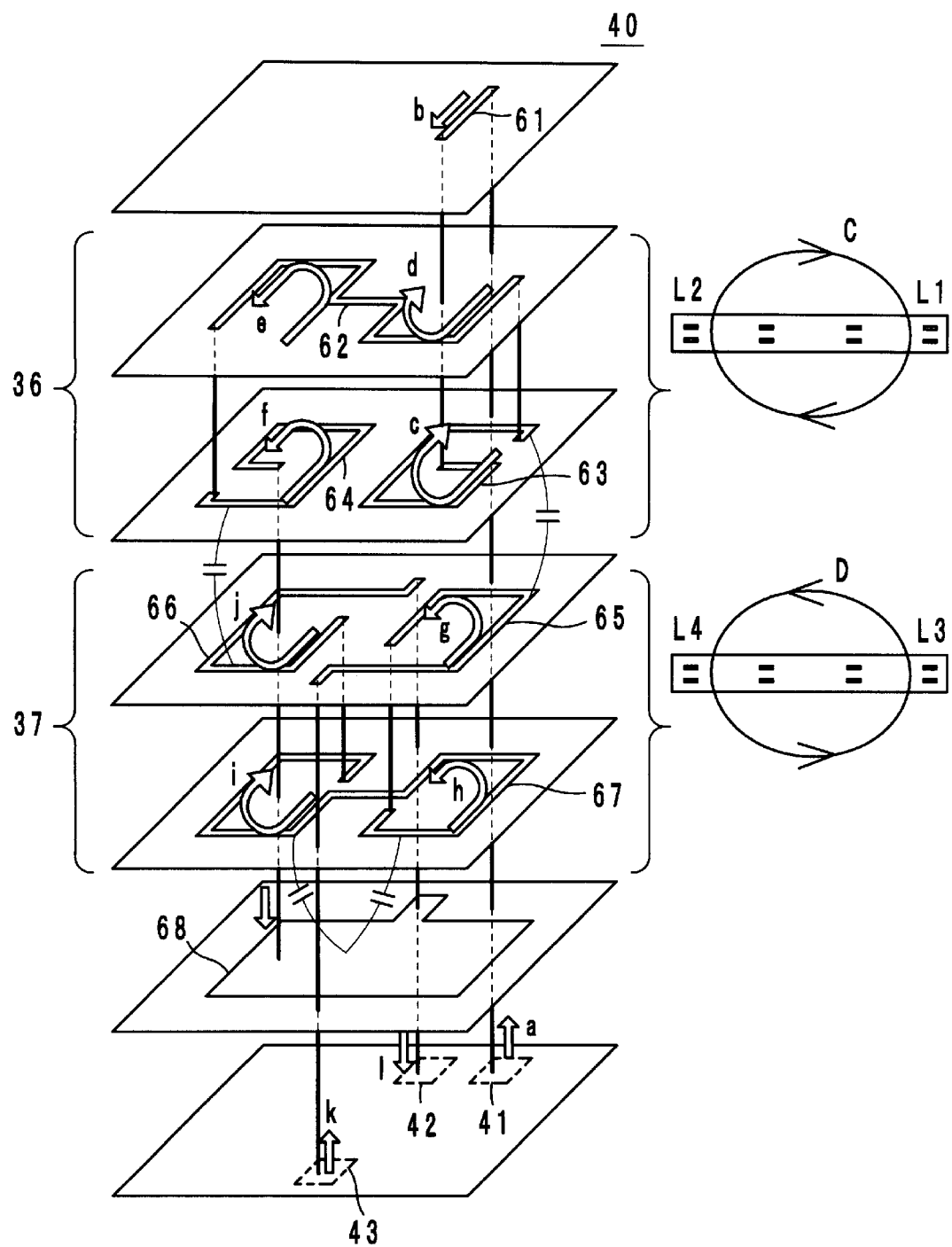
FIG. 6 is a diagram illustrating the operation principle of the frequency stabilization circuit illustrated in FIG. 5.

As illustrated in FIG. 6, in the first example of the frequency stabilization circuit 35, a high-frequency signal current input from the feeding terminal 41 flows as represented by arrows a and b, is led to the first inductance element L1 (the conductors 62 and 63) as represented by arrows c and d, and is led to the second inductance element L2 (the conductors 62 and 64) as represented by arrows e and f. A magnetic field C generated by a primary current (represented by the arrows c and d) excites a high-frequency signal current at the third inductance element L3 (the conductors 65 and 67) as represented by arrows g and h, and an induction current (secondary current) flows. Similarly, the magnetic field C generated by a primary current (represented by the arrows e and f) excites a high-frequency signal current at the fourth inductance element L4 (the conductors 66 and 67) as represented by arrows i and j, and an induction current (secondary current) flows. As a result, a high-frequency signal current represented by an arrow k flows through the antenna terminal 43, and a high-frequency signal current represented by an arrow l flows through the ground terminal 42. When the current (represented by the arrow a) flows through the feeding terminal 41 in an opposite direction, the other currents also flow in opposite directions. Since the coil pattern 63 corresponding to the first inductance element L1 and the coil pattern 65 corresponding to the third inductance element L3 face each other, electric field coupling between them occurs, a current (displacement current) generated by the electric field coupling flows in the same direction as that of an induction current, and the degree of coupling between them is increased by magnetic field coupling and the electric field coupling. Similarly, between the coil pattern 64 corresponding to the second inductance element L2 and the coil pattern 66 corresponding to the fourth inductance element L4, magnetic field coupling and electric field coupling occur.

The first and second inductance elements L1 and L2 are coupled to each other in the same phase in the primary-side series circuit 36, so that a closed magnetic circuit is formed. The third and fourth inductance elements L3 and L4 are coupled to each other in the same phase in the secondary-side series circuit 37, so that a closed magnetic circuit is formed. Accordingly, an energy loss between the first and second inductance elements L1 and L2 and an energy loss between the third and fourth inductance elements L3 and L4 can be reduced. By setting substantially the same element value as the inductance values of the first and second inductance elements L1 and L2 and setting substantially the same element value as the inductance values of the third and fourth inductance elements L3 and L4, leakage of a magnetic field in a closed magnetic circuit can be reduced and an energy loss can be further reduced. Since electric field coupling between the third and fourth inductance elements L3 and L4 occurs via the ground conductor 68, a displacement current generated by the electric field coupling increases the degree of coupling between the elements L3 and L4. Similarly, by generating electric field coupling between the elements L1 and L2, the degree of coupling between the elements L1 and L2 can be increased.

The magnetic field C excited by a primary current in the primary-side series circuit 36 and a magnetic field D excited by a secondary current in the secondary-side series circuit 37 cancel each other with an induction current. Using an induction current, an energy loss is reduced and the high degrees of coupling between the first and third inductance elements L1 and L3 and between the second and fourth inductance elements L2 and L4 are achieved. That is, the primary-side and secondary-side series circuits 36 and 37 are coupled with a high coupling degree.

It is desired that the inductance value of the frequency stabilization circuit 35 be smaller than that of the connection line 33 connecting the two radiating elements 11 and 21. The reason for this is that the effect of the inductance value of the connection line 33 on a frequency characteristic can be reduced. By achieving the coupling between the first and second inductance elements L1 and L2 in the same phase and the coupling between the third and fourth inductance elements L3 and L4 in the same phase, the inductance value of the frequency stabilization circuit 35 can be reduced.

Thus, according to this preferred embodiment, since the primary-side and secondary-side series circuits 36 and 37 use coupling (electromagnetic field coupling) between closed magnetic circuits, impedance matching can be independently achieved on the primary and secondary sides by performing impedance matching with the feeding circuit 30 in the primary-side series circuit 36 and impedance matching with the first radiating element 11 in the secondary-side series circuit 37. Furthermore, since the energy transmission efficiency of a high-frequency signal is improved, it is possible to stabilize the frequency characteristic of a high-frequency signal in a wide band without being significantly affected by the shapes and open/closed states of the radiating elements 11 and 21 and the casings 10 and 20.

Figure 7:
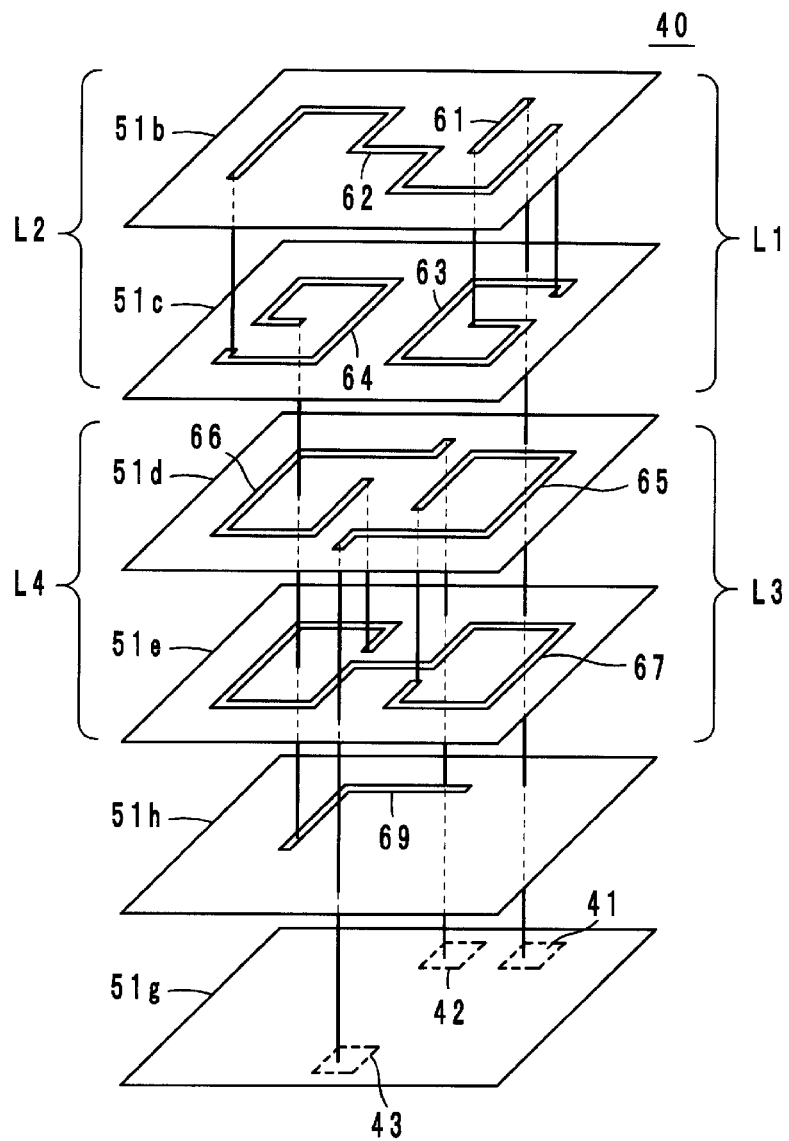
FIG. 7 is an exploded perspective view of a second example of a frequency stabilization circuit in the form of a laminate.

Next, a second example of the frequency stabilization circuit 35 will be described with reference to FIG. 7. The second example is basically the same as the first example except that the base material layer 51a is not provided, the conductor 61 is disposed on the base material layer 51b, the ground conductor 68 is not provided, and a connection conductor 69 is disposed on a base material layer 51h. In the second example, since the ground conductor 68 is not provided, it is desired that a shielding conductor equivalent to the ground conductor 68 be disposed at or in a printed circuit board on which the laminate 40 is mounted.

Second Preferred Embodiment

Figure 8:
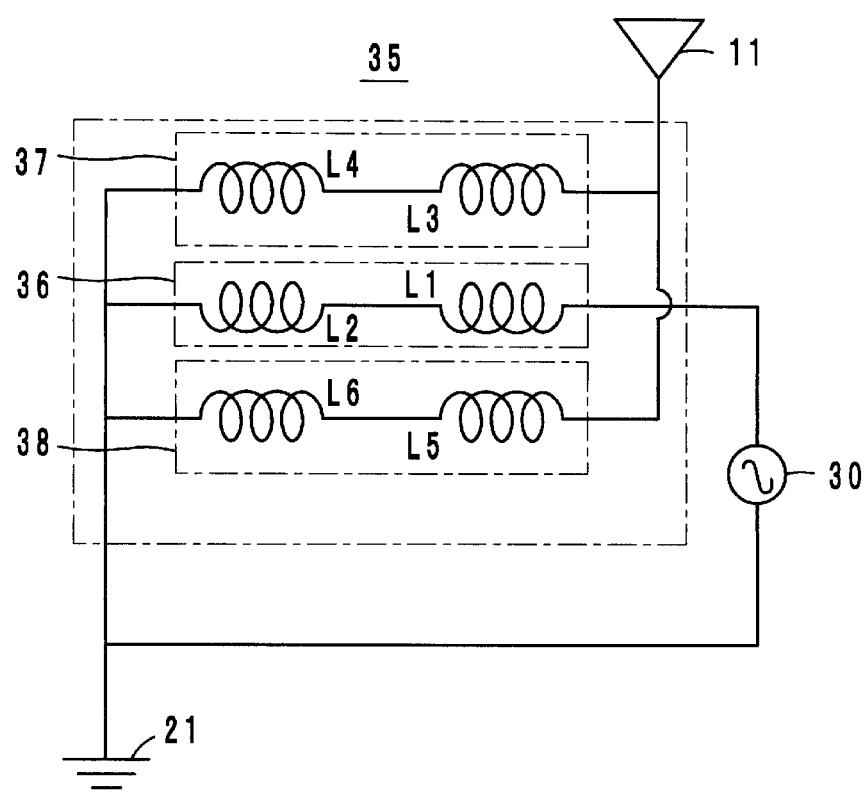
FIG. 8 is an equivalent circuit diagram of an antenna apparatus according to a second preferred embodiment of the present invention.

An antenna apparatus according to the second preferred embodiment is illustrated in FIG. 8. The frequency stabilization circuit 35 according to this preferred embodiment includes a secondary-side series circuit 38 (secondary-side reactance circuit) in addition to the primary-side and secondary-side series circuits 36 and 37. A fifth inductance element L5 and a sixth inductance element L6 included in the secondary-side series circuit 38 are coupled to each other in the same phase. The fifth and first inductance elements L5 and L1 are coupled to each other in opposite phases, and the sixth and second inductance elements L6 and L2 are coupled to each other in opposite phases. One end of the fifth inductance element L5 is connected to the first radiating element 11, and one end of the sixth inductance element L6 is connected to the second radiating element 21.

Figure 9:
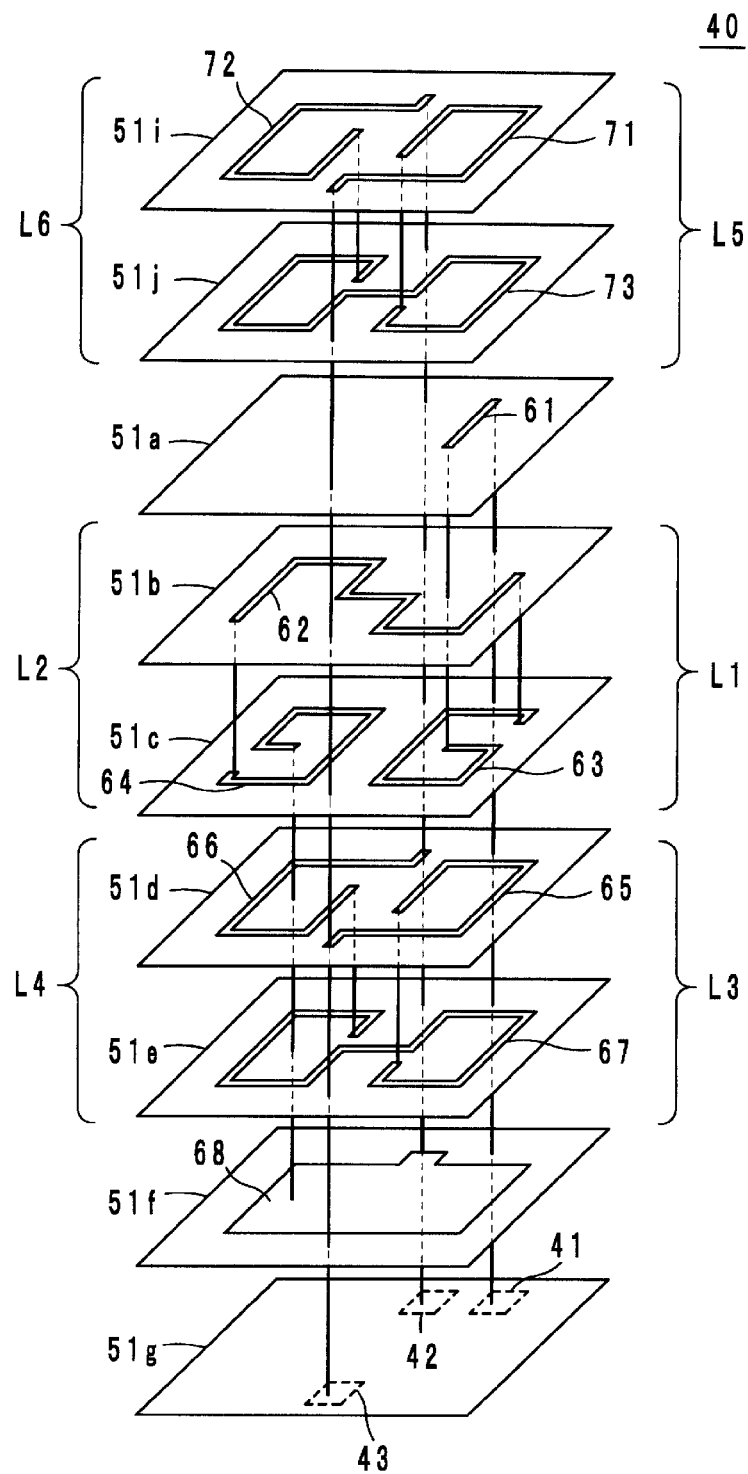
FIG. 9 is an exploded perspective view of a third example of a frequency stabilization circuit in the form of a laminate.

A third example of the frequency stabilization circuit 35 which is preferably formed as the laminate 40 will be described with reference to FIG. 9. In the third example, base material layers 51i and 51j on which conductors 71, 72, and 73 to be the fifth and sixth inductance elements L5 and L6 in the secondary-side series circuit 38 are formed are laminated on the laminate 40 illustrated in the first example. That is, like the first to fourth reactance elements, fifth and sixth reactance elements are the fifth inductance element L5 and the sixth inductance element L6, respectively. The fifth and sixth inductance elements L5 and L6 are defined by coil patterns. The coil patterns defining the fifth and sixth inductance elements L5 and L6 are wound so that magnetic fields generated at the inductance elements L5 and L6 define a closed magnetic circuit.

The operation of the second preferred embodiment and the third example in the form of the laminate 40 is basically the same as that of the first preferred embodiment and the first example. In the second preferred embodiment, the primary-side series circuit 36 is sandwiched between the two secondary-side series circuits 37 and 38, so that the transmission loss of high-frequency signal energy from the primary-side series circuit 36 to the secondary-side series circuits 37 and 38 is reduced.

Figure 10:
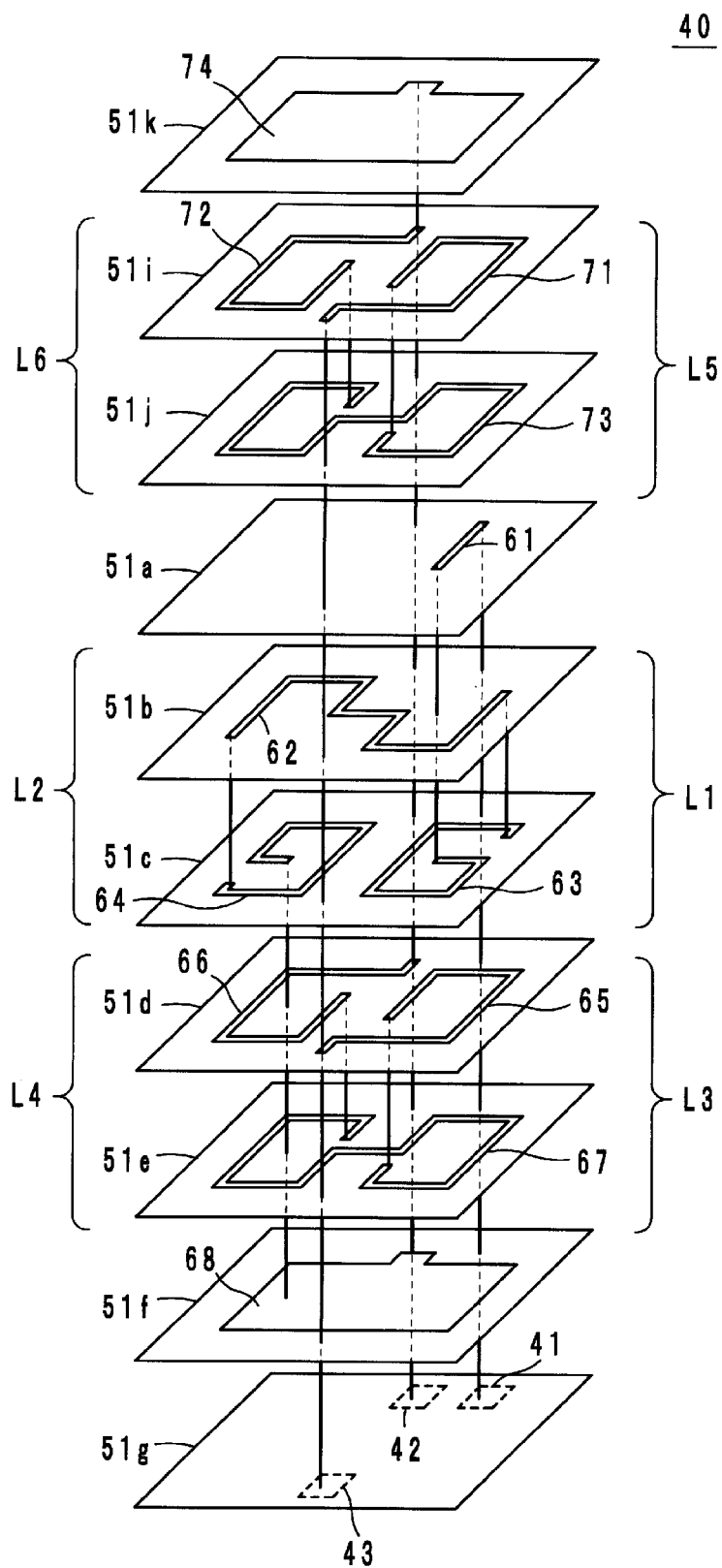
FIG. 10 is an exploded perspective view of a fourth example of a frequency stabilization circuit in the form of a laminate.

Next, a fourth example of the frequency stabilization circuit 35 which is preferably formed as the laminate 40 will be described with reference to FIG. 10. In the fourth example, a base material layer 51k on which a ground conductor 74 is disposed is laminated on the third example preferably in the form of the laminate 40. Like the ground conductor 68 at the bottom, the ground conductor 74 has an area that is sufficient to cover openings of coils formed by the conductors 71, 72, and 73. Accordingly, in the fourth example, by disposing the ground conductor 74, magnetic fields generated by the coils are not easily affected by magnetic fields from various wiring lines disposed directly above the laminate 40. Thus, even if the first and third inductance elements L1 and L3 are coupled to each other in the same phase and the second and fourth inductance elements L2 and L4 are coupled to each other in the same phase, the primary-side and secondary-side series circuits 36 and 37 can be coupled.

Third Preferred Embodiment

Figure 11:
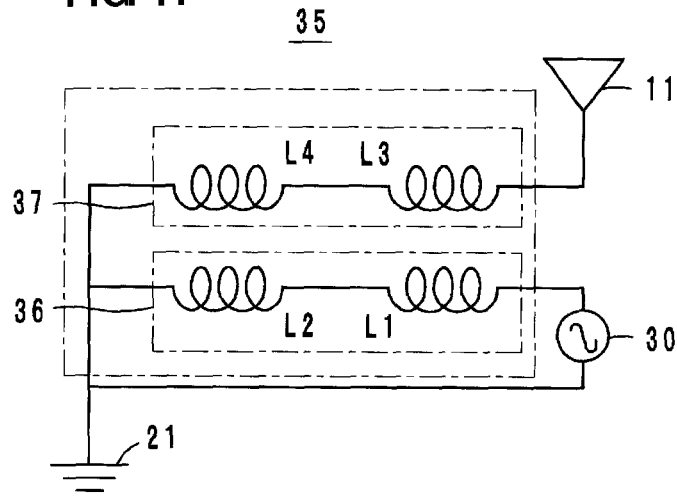
FIG. 11 is an equivalent circuit diagram of an antenna apparatus according to a third preferred embodiment of the present invention.

An antenna apparatus according to the third preferred embodiment is illustrated in FIG. 11. The frequency stabilization circuit 35 according to this preferred embodiment is basically the same as the frequency stabilization circuit 35 according to the first preferred embodiment except that the first and third inductance elements L1 and L3 are coupled to each other in the same phase and the second and fourth inductance elements L2 and L4 are coupled to each other in the same phase. That is, the first and third inductance elements L1 and L3 are coupled to each other mainly via a magnetic field, and the second and fourth inductance elements L2 and L4 are coupled to each other mainly via a magnetic field. The operational effects and advantages of the third preferred embodiment are basically the same as that of the first preferred embodiment.

The coil patterns defining the inductance elements L1 to L4 are wound as above, so that a closed magnetic circuit (a first closed magnetic circuit) is defined between the inductance elements L1 and L2, a closed magnetic circuit (a second closed magnetic circuit) is defined between the inductance elements L3 and L4, and a closed magnetic circuit (a third closed magnetic circuit) is defined by the first and second closed magnetic circuits. As a result, the loss of a high-frequency signal can be minimized at the inductance elements L1 to L4.

Fourth Preferred Embodiment

Figure 12:
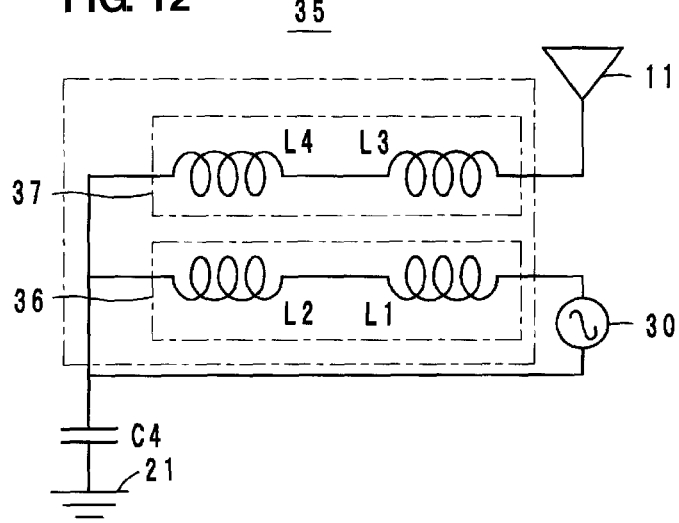
FIG. 12 is an equivalent circuit diagram of an antenna apparatus according to a fourth preferred embodiment of the present invention.

An antenna apparatus according to the fourth preferred embodiment is illustrated in FIG. 12. The frequency stabilization circuit 35 according to this preferred embodiment is similar to the frequency stabilization circuit 35 according to the first preferred embodiment, and the operational effects and advantages of the frequency stabilization circuit 35 according to this preferred embodiment are similar to that of the frequency stabilization circuit 35 according to the first preferred embodiment. The difference between the fourth and first preferred embodiments is that a capacitance element C4 is disposed between the frequency stabilization circuit 35 and the second radiating element 21. The capacitance element C4 functions as a bias cut element to cut a direct-current component and a low-frequency component, and also functions as an ESD countermeasure element.

Fifth Preferred Embodiment

Figure 13:
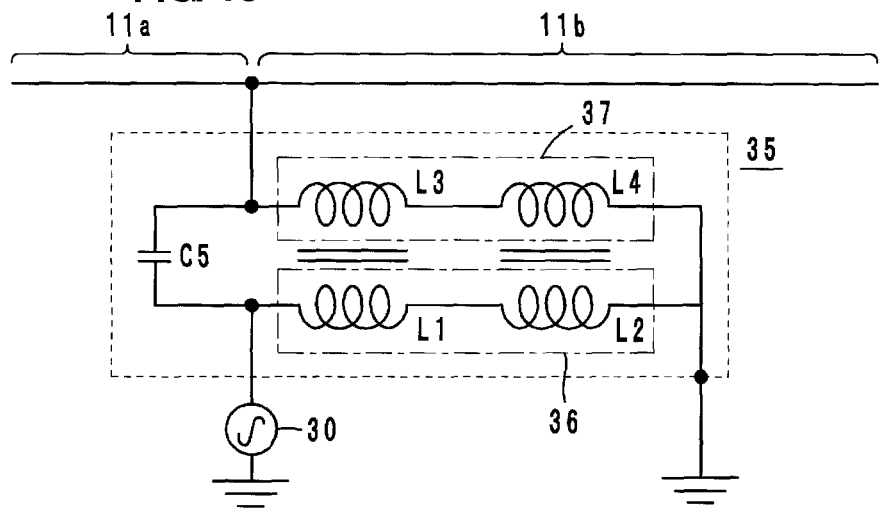
FIG. 13 is an equivalent circuit diagram of an antenna apparatus according to a fifth preferred embodiment of the present invention.

An antenna apparatus according to the fifth preferred embodiment is illustrated in FIG. 13. This antenna apparatus is used for a multi-band mobile radio communication system for GSM and CDMA (the 800 MHz band, the 900 MHz band, the 1800 MHz band, and the 1900 MHz band). The frequency stabilization circuit 35 according to this preferred embodiment is basically the same as the frequency stabilization circuit 35 according to the first preferred embodiment except that a capacitance element C5 is disposed between the primary-side and secondary-side series circuits 36 and 37, and the operational effects and advantages of the frequency stabilization circuit 35 according to this preferred embodiment are basically the same as that of the frequency stabilization circuit 35 according to the first preferred embodiment. Branched monopole antennas 11a and 11b are disposed as radiating elements. The capacitance element C5 functions as a coupling capacitor to transmit a high-band-side signal (in the 1800 MHz band and the 1900 MHz band) from the branched monopole antennas 11a and 11b to the feeding circuit 30 (or vice versa) not via the primary-side and secondary-side series circuits 36 and 37. When an impedance ratio defined by the primary-side and secondary-side series circuits 36 and 37 matches both the high-band side (the 1800 MHz band and the 1900 MHz band) and a low-band side (the 800 MHz band and the 900 MHz band), the capacitance element C5 may not be provided.

This antenna apparatus can be used as a main antenna for a mobile communication terminal. The branched monopole antenna 11a functions as a high-band-side (the 1800 to 2400 MHz band) antenna radiating element, and the branched monopole antenna 11b functions as a low-band-side (the 800 to 900 MHz band) antenna radiating element. The branched monopole antennas 11a and 11b do not have to resonate as antennas in corresponding frequency bands, since the frequency stabilization circuit 35 matches the characteristic impedances of the antennas 11a and 11b to the impedance of an RF circuit. For example, the frequency stabilization circuit 35 matches the characteristic impedance of the antenna 11b to the impedance (usually about 50Ω, for example) of an RF circuit in the 800 MHz to 900 MHz band. As a result, a signal from an RF circuit can be transmitted from the branched monopole antenna 11b, or a signal to be transmitted to the RF circuit can be received by the branched monopole antenna 11b.

Thus, in a case where impedance matching is performed in a plurality of frequency bands that are far apart, impedance matching can be performed in each of these frequency bands with a plurality of frequency stabilization circuits 35 connected in parallel. Alternatively, by coupling a plurality of secondary-side series circuits 37 to the primary-side series circuit 36, impedance matching can be performed in each of these frequency bands with the secondary-side series circuits 37.

Sixth Preferred Embodiment

Figure 14A:
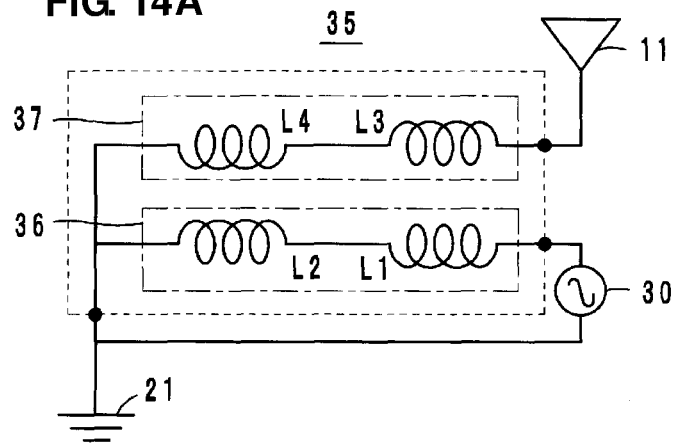
FIGS. 14A and 14B are equivalent circuit diagrams of an antenna apparatus according to a sixth preferred embodiment of the present invention.

As illustrated in FIG. 14A, the frequency stabilization circuit 35 used in an antenna apparatus according to the sixth preferred embodiment includes a primary-side reactance circuit connected to the feeding circuit 30 and a secondary-side reactance circuit coupled to the primary-side reactance circuit via an electronic field or a magnetic field. The primary-side reactance circuit includes the primary-side series circuit 36 including a first reactance element and a second reactance element connected in series to the first reactance element. The secondary-side reactance circuit includes the secondary-side series circuit 37 including a third reactance element coupled to the first reactance element and a fourth reactance element that is connected in series to the third reactance element and is coupled to the second reactance element. More specifically, the first, second, third, and fourth reactance elements are the first, second, third, and fourth inductance elements L1, L2, L3, and L4, respectively.

One end of the primary-side series circuit 36 (one end of the first inductance element L1) is connected to the feeding circuit 30, and one end of the secondary-side series circuit 37 (one end of the third inductance element L3) is connected to the first radiating element 11. The other end of the primary-side series circuit 36 (the other end of the second inductance element L2) and the other end of the secondary-side series circuit 37 (the other end of the fourth inductance element L4) are connected to the second radiating element 21.

Figure 14B:
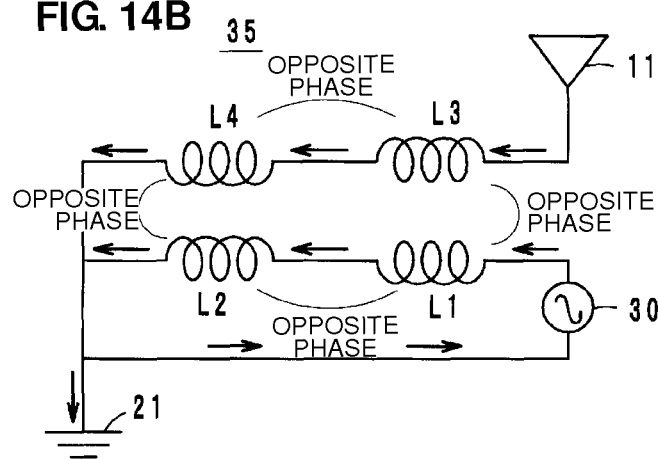

As illustrated in FIG. 14B, the first and second inductance elements L1 and L2 are coupled to each other in opposite phases, and the third and fourth inductance elements L3 and L4 are coupled to each other in opposite phases. The first and third inductance elements L1 and L3 are coupled to each other in opposite phases, and the second and fourth inductance elements L2 and L4 are coupled to each other in opposite phases.

In the frequency stabilization circuit 35 having the above-described configuration, a high-frequency signal current that has flowed from the feeding circuit 30 to the primary-side series circuit 36 is led to the first inductance element L1, and is led to the third inductance element L3 via an induction field as a secondary current when each inductance element is defined by a coil pattern. A high-frequency signal current that has been led to the second inductance element L2 is led to the fourth inductance element L4 via an induction field as a secondary current. As a result, a high-frequency signal current flows in a direction represented by arrows in FIG. 14B.

In the sixth preferred embodiment, the first and second inductance elements L1 and L2 operate so that their magnetic fields reinforce each other, and the third and fourth inductance elements L3 and L4 operate so that their magnetic fields reinforce each other. Magnetic fields between the primary-side and secondary-side series circuits 36 and 37 define a closed magnetic circuit.

Figure 15:
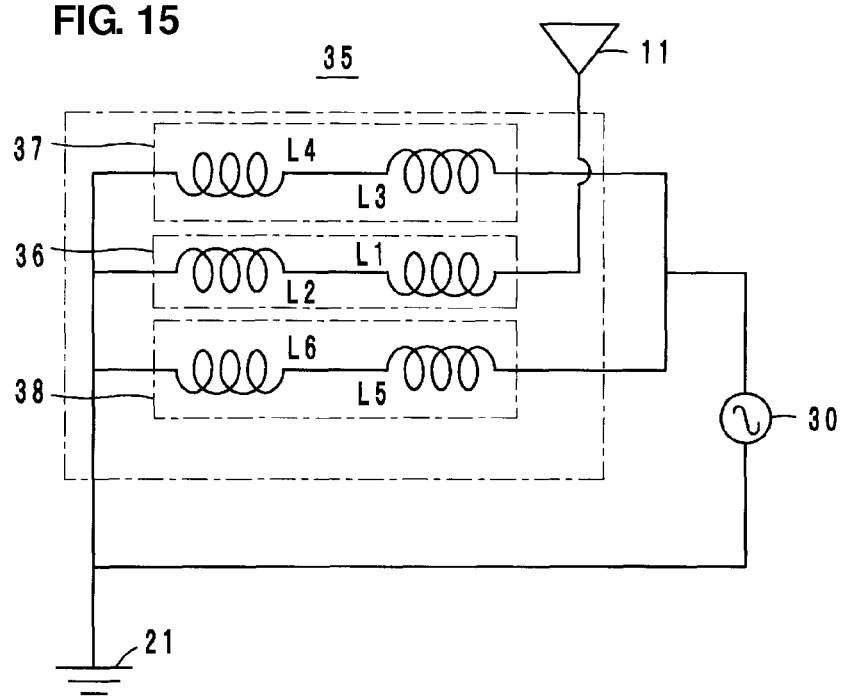
FIG. 15 is an equivalent circuit diagram of an application example of an antenna apparatus according to the sixth preferred embodiment of the present invention.

In particular, as illustrated in FIG. 15, by sandwiching the primary-side series circuit 36 between the secondary-side series circuit 37 including a series circuit of the inductance elements L3 and L4 and the secondary-side series circuit 38 including a series circuit of the inductance elements L5 and L6, the transmission loss of high-frequency signal energy from the secondary-side series circuits 37 and 38 to the primary-side series circuit 36 can be reduced. In this application example, the winding directions of the inductance elements L2, L4, and L6 are different from those of the inductance elements L2, L4, and L6 in the antenna apparatus illustrated in FIG. 8.

Figure 16A:
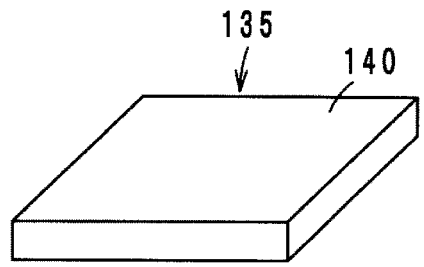
Figure 16B:
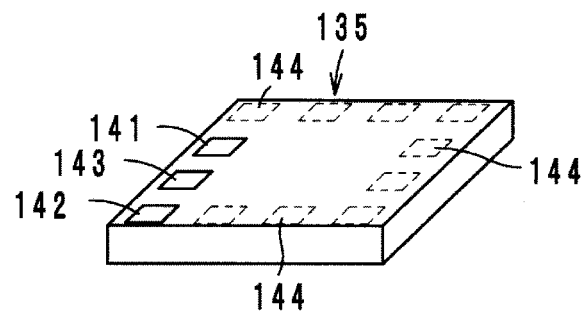

A frequency stabilization circuit 35 can be preferably formed as a chip laminate 140 illustrated in FIGS. 16A and 16B. The laminate 140 is obtained by laminating a plurality of base material layers formed of a dielectric or a magnetic substance. On the undersurface of the laminate 140, a feeding terminal 141 connected to the feeding circuit 30, a ground terminal 142 connected to the second radiating element 21, and an antenna terminal 143 connected to the first radiating element 11 are disposed. In addition, on the undersurface, NC terminals 144 used for mounting are also disposed. On the surface of the laminate 140, an inductor or a capacitor for impedance matching may be disposed as appropriate. Alternatively, in the laminate 140, an inductor or a capacitor may be defined by an electrode pattern.

Figure 17:
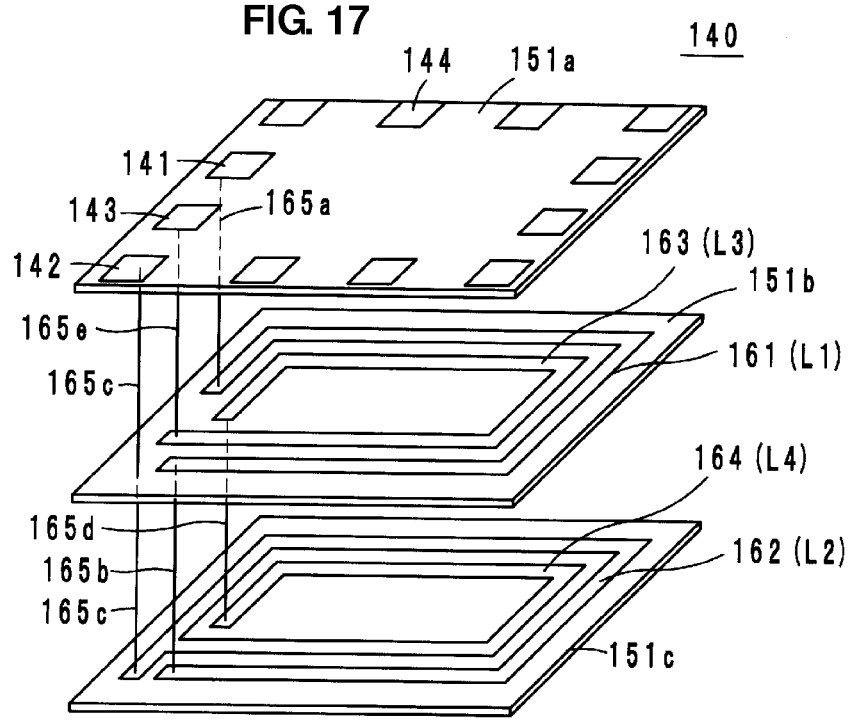
FIG. 17 is an exploded perspective view of the first example of a frequency stabilization device.

A first example of the frequency stabilization device 135 in the laminate 140 will be described with reference to FIG. 17. In the first example, the terminals 141, 142, 143, and 144 are disposed on a base material layer 151a that is the first layer, conductors 161 and 163 to be the first and third inductance elements L1 and L3, respectively, are disposed on a base material layer 151b that is the second layer, and conductors 162 and 164 to be the second and fourth inductance elements L2 and L4, respectively, are disposed on a base material layer 151c that is the third layer.

The conductors 161 to 164 can be formed by performing screen printing with paste mainly composed of a conductive material such as silver or copper or etching of a metallic foil. In order to form the base material layers 151a to 151c with a dielectric, a glass-ceramic material or an epoxy resin material can be used. In order to form the base material layers 151a to 151c with a magnetic substance, a ferrite ceramic material or a resin material containing ferrite can be used.

By laminating the base material layers 151a to 151c, the conductors 161 to 164 and the terminals 141, 142, and 143 are connected via interlayer connection conductors (via-hole conductors), and the equivalent circuit illustrated in FIG. 14A is formed. That is, the feeding terminal 141 is connected to one end of the conductor 161 (the first inductance element L1) via a via-hole conductor 165*a*, and the other end of the conductor 161 is connected to one end of the conductor 162 (the second inductance element L2) via a via-hole conductor 165*b*. The other end of the conductor 162 is connected to the ground terminal 142 via a via-hole conductor 165*c*, and the other end of the branched conductor 164 (the fourth inductance element L4) is connected to one end of the conductor 163 (the third inductance element L3) via a via-hole conductor 165*d*. The other end of the conductor 163 is connected to the antenna terminal 143 via a via-hole conductor 165*e*.

As described previously, by disposing the inductance elements L1 to L4 in the laminate 140 formed of a dielectric or a magnetic substance, in particular, disposing a portion of coupling between the primary-side and secondary-side series circuits 36 and 37 in the laminate 140, the frequency stabilization circuit 135 is not easily affected by an electronic element disposed near the laminate 140. As a result, it is possible to further stabilize a frequency characteristic.

By disposing the first and third inductance elements L1 and L3 on the same layer (the base material layer 151*b*) in the laminate 140 and disposing the second and fourth inductance elements L2 and L4 on the same layer (the base material layer 151*c*) in the laminate 140, the thickness of the laminate 140 (the frequency stabilization device 135) is reduced. Since the first and third inductance elements L1 and L3 coupled to each other and the second and fourth inductance elements L2 and L4 coupled to each other can be formed in the same process (for example, the application of conductive paste), the variations in the coupling degree caused by misalignment between lamination layers are prevented and suppressed, and reliability is improved.

Figure 18:
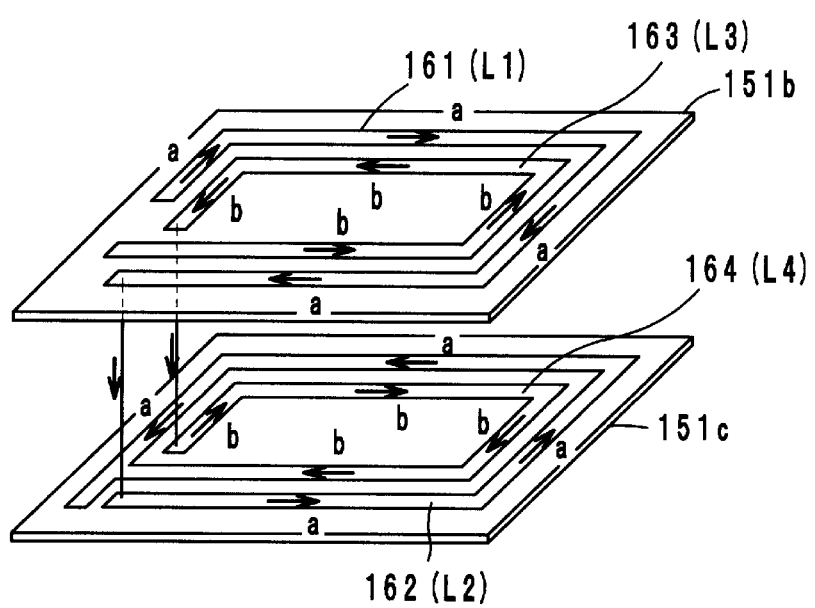
FIG. 18 is a diagram illustrating the operation principle of the first example of a frequency stabilization device.

In the first example of the frequency stabilization device 135, as illustrated in FIG. 18, a high-frequency signal current input from the feeding terminal 141 flows to the first and second inductance elements L1 and L2 (the conductors 161 and 162) as represented by arrows a. A magnetic field generated by this primary current (represented by the arrows a) excites a high-frequency signal current at the third and fourth inductance elements L3 and L4 (the conductors 163 and 164) as represented by arrows b, and an induction current (secondary current) flows. On the other hand, when the direction of a current flowing through the first and second inductance elements L1 and L2 (the conductors 161 and 162) is opposite to the direction represented by the arrows a, a current flows through the third and fourth inductance elements L3 and L4 (the conductors 163 and 164) in a direction opposite to the direction represented by the arrows b.

The first and second inductance elements L1 and L2 are coupled to each other in opposite phases in the primary-side series circuit 36, so that a closed magnetic circuit is formed. The third and fourth inductance elements L3 and L4 are coupled to each other in opposite phases in the secondary-side series circuit 37, so that a closed magnetic circuit is formed. Accordingly, an energy loss can be reduced. By setting substantially the same inductance value for the first and second inductance elements L1 and L2 and setting substantially the same inductance value for the third and fourth inductance elements L3 and L4, leakage of a magnetic field in a closed magnetic circuit can be reduced and an energy loss can be further reduced.

A magnetic field excited by a primary current in the primary-side series circuit 36 and a magnetic field excited by a secondary current in the secondary-side series circuit 37 cancel each other with an induction current. Using an induction current, an energy loss is reduced and the high degrees of coupling between the first and third inductance elements L1 and L3 and between the second and fourth inductance elements L2 and L4 are achieved. That is, the primary-side and secondary-side series circuits 36 and 37 are coupled with a high coupling degree.

It is desired that the inductance value of the frequency stabilization device 135 be smaller than that of the connection line 33. The reason for this is that the effect of the inductance value of the connection line 33 can be reduced. By coupling the first and second inductance elements L1 and L2 in opposite phases and the third and fourth inductance elements L3 and L4 in opposite phases, the inductance value of the frequency stabilization device 135 can be reduced.

Thus, according to the first example, since the primary-side and secondary-side series circuits 36 and 37 are coupled using an electromagnetic field (a closed magnetic circuit), impedance matching can be independently performed on the primary and secondary sides by performing impedance matching with the feeding circuit 30 in the primary-side series circuit 36 and impedance matching with the first radiating element 11 in the secondary-side series circuit 37. Furthermore, since the transmission efficiency of high-frequency signal energy is increased, it is possible to stabilize the frequency characteristic of a high-frequency signal in a wide band without being affected by the shapes and open/closed states of the radiating elements 11 and 21 and the casings 10 and 20. By disposing the first and third inductance elements L1 and L3 on the same layer and disposing the second and fourth inductance elements L2 and L4 on the same layer, the thickness of the laminate 40 is reduced, the variations in the coupling degree caused by misalignment between lamination layers are prevented and suppressed, and reliability is improved.

Figure 19:
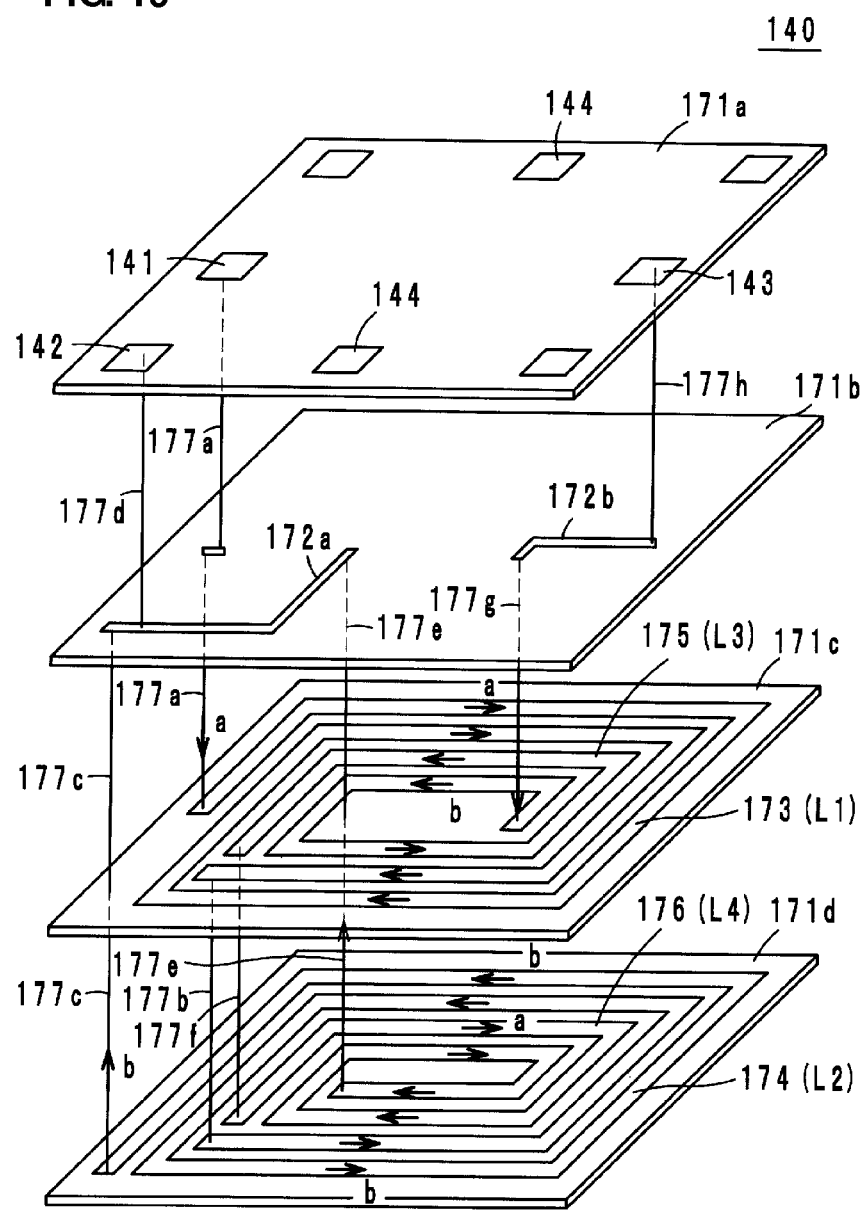
FIG. 19 is an exploded perspective view of a second example of a frequency stabilization device.

Next, the second example of a frequency stabilization device will be described with reference to FIG. 19. The terminals 141, 142, 143, and 144 are disposed on a base material layer 171*a* that is the first layer, and conductors 172*a* and 172*b* are disposed on a base material layer 171*b* that is the second layer. Conductors 173 and 175 that include two turns and are to be the first and third inductance elements L1 and L3, respectively, are disposed on a base material layer 171*c* that is the third layer, and conductors 174 and 176 that include two turns and are to be the second and fourth inductance elements L2 and L4, respectively, are disposed on a base material layer 171*d* that is the fourth layer.

By laminating the base material layers 171*a* to 171*d*, the conductors 173 to 176 and the terminals 141, 142, and 143 are connected via interlayer connection conductors (via-hole conductors), and the equivalent circuit illustrated in FIG. 14A is formed. That is, the feeding terminal 141 is connected to one end of the conductor 173 (the first inductance element L1) via a via-hole conductor 177*a*, and the other end of the conductor 173 is connected to one end of the conductor 174 (the second inductance element L2) via a via-hole conductor 177*b*. The other end of the conductor 174 is connected to the ground terminal 142 via a via-hole conductor 177*c*, the conductor 172*a*, and a via-hole conductor 177*d*, the other end of the conductor 172*a* is connected to one end of the conductor 176 (the fourth inductance element L4) via a via-hole conductor 177*e*, and the other end of the conductor 176 is connected to one end of the conductor 175 (the third inductance element L3) via a via-hole conductor 177*f*. The other end of the conductor 175 is connected to the antenna terminal 143 via a via-hole conductor 177*g*, the conductor 172*b*, and a via-hole conductor 177*h*.

In the second example of the frequency stabilization device, operational effects and advantages similar to those obtained in the first example can be obtained. The relationship between a primary current (represented by arrows a) and a secondary current (represented by arrows b) is as illustrated in FIG. 19. In particular, in the second example, the conductors 173 to 176 defining the inductance elements L1 to L4 individually include two turns. By increasing the number of windings in a coil, an inductance value can be increased. The number of windings may be equal to or larger than three. Alternatively, each coil may be wound through a plurality of layers.

Figure 20:
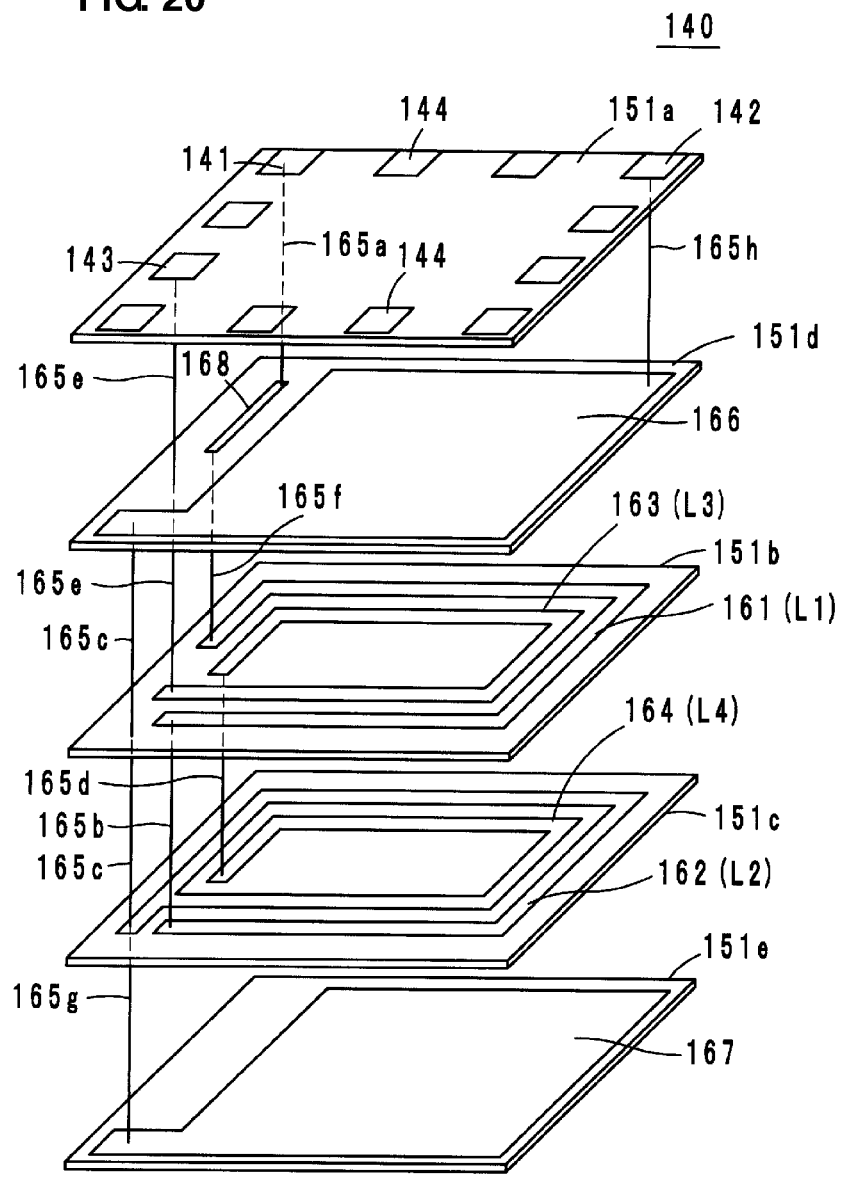
FIG. 20 is an exploded perspective view of a third example of a frequency stabilization device.

Next, the third example of a frequency stabilization device will be described with reference to FIG. 20. In the third example, a base material layer 151d on which a ground conductor 166 is located is disposed between the base material layers 151a and 151b in the first example in the form of the laminate 140, and a base material layer 151e on which a ground conductor 167 is located is disposed under the base material layer 151c.

That is, the feeding terminal 141 is connected to one end of the conductor 161 (the first inductance element L1) via the via-hole conductor 165a, a conductor 168 disposed on the base material layer 151d, and a via-hole conductor 165f, and the other end of the conductor 161 is connected to one end of the conductor 162 (the second inductance element L2) via the via-hole conductor 165b. The other end of the conductor 162 is connected to one end portion of the ground conductor 166 via the via-hole conductor 165c, and the other end portion of the ground conductor 166 is connected to the ground terminal 142 via a via-hole conductor 165h. The other end of the conductor 162 is connected to the ground conductor 167 via a via-hole conductor 165g. The other end of the conductor 164 (the fourth inductance element L4) branched off from the conductor 162 is connected to one end of the conductor 163 (the third inductance element L3) via a via-hole conductor 165d. The other end of the conductor 163 is connected to the antenna terminal 143 via the via-hole conductor 165e.

In the third example of the frequency stabilization device, operational effects and advantages similar to those obtained in the first example can be obtained. In particular, since the ground conductors 166 and 167 are disposed at or in the top and bottom of the laminate 140 so that they cover openings of coils defined by the conductors 161 to 164 in the third example, magnetic fields generated by the coils are not easily affected by various wiring lines on a printed circuit board. That is, the variations in the L values of the inductance elements L1 to L4 are not easily made.

Figure 21A:
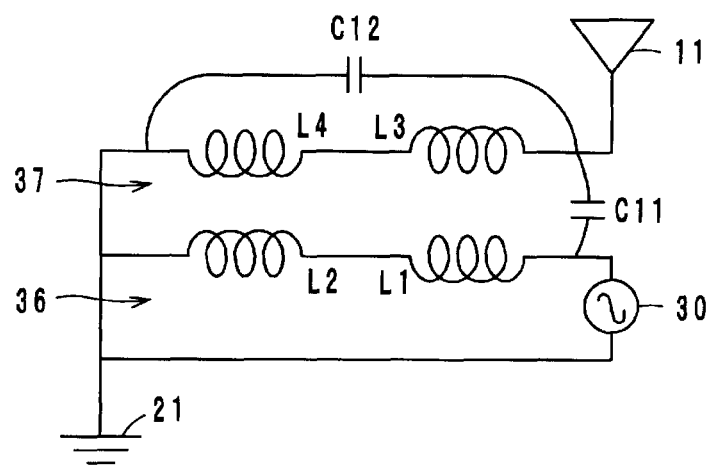
FIG. 21A is an equivalent circuit diagram of an antenna apparatus according to a seventh preferred embodiment of the present invention.

An antenna apparatus according to the seventh preferred embodiment is illustrated in FIG. 21A. The configuration of the frequency stabilization device 135 of this preferred embodiment preferably is basically the same as that of the frequency stabilization circuit 35 illustrated in FIG. 2A except that a capacitance element C11 is connected between the primary-side and secondary-side series circuits 36 and 37 (between first ends of the first and third inductance elements L1 and L3), and a capacitance element C12 is connected in parallel to the third and fourth inductance elements L3 and L4.

Figure 21B:
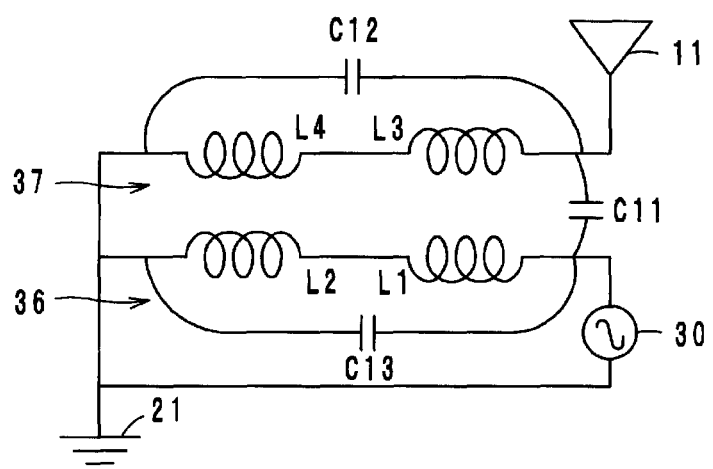
FIG. 21B is an equivalent circuit diagram of an exemplary modification of the antenna apparatus.

As illustrated in FIG. 21B, a capacitance element C13 may be connected in parallel to the first and second inductance elements L1 and L2 in addition to the capacitance elements C11 and C12.

Figure 22:
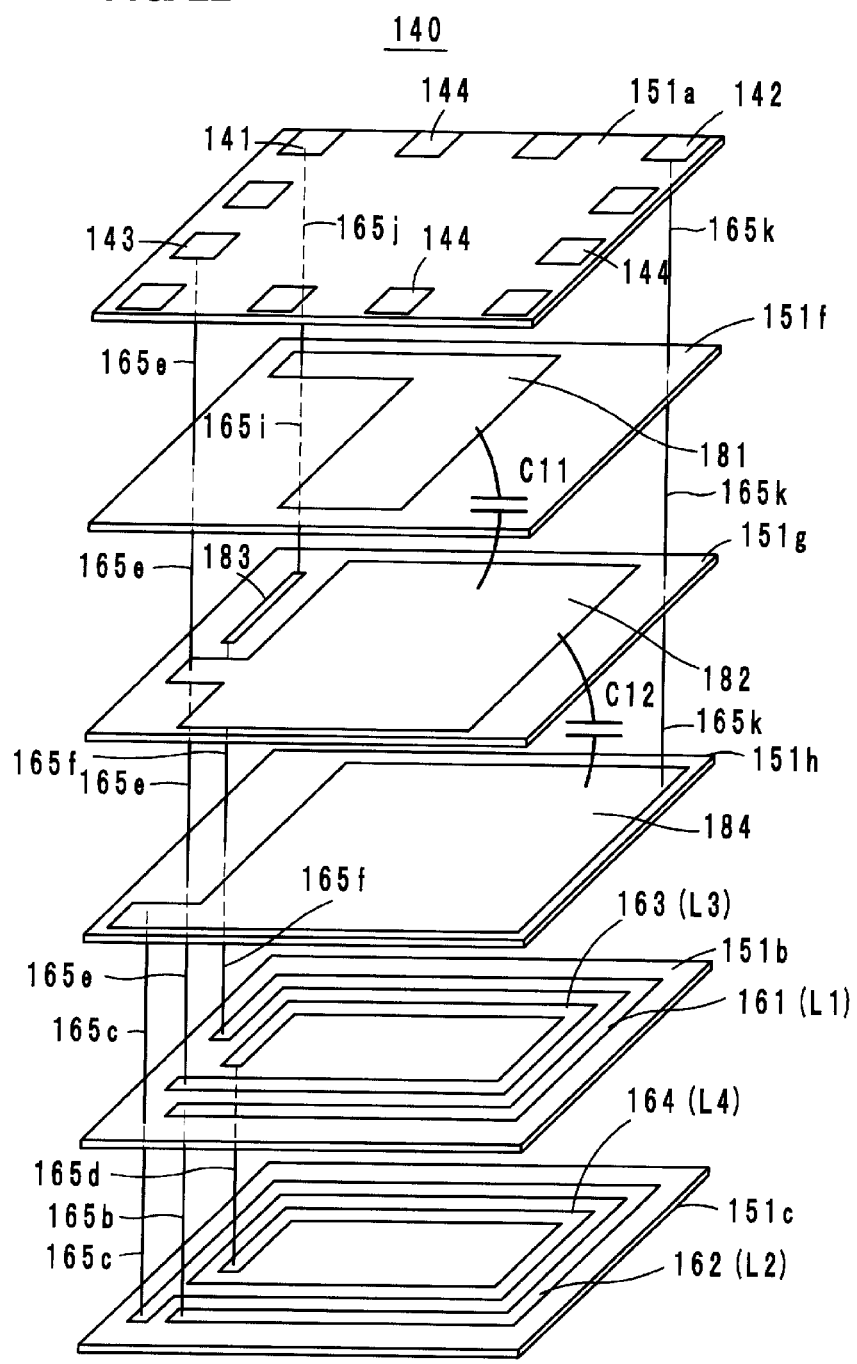
FIG. 22 is an exploded perspective view of a fourth example of a frequency stabilization device.

The frequency stabilization device 135 (the fourth example) illustrated in FIG. 21A preferably is formed as the laminate 140 illustrated in FIG. 22. In the laminate 140, the base material layer 151b on which the conductors 161 and 163 (the inductance elements L1 and L3) are disposed and the base material layer 151c on which the conductors 162 and 164 (the inductance elements L2 and L4) are disposed are the same as those illustrated in FIG. 17. Base material layers 151f, 151g, and 151h are laminated between the base material layers 151a and 151b. A capacitance electrode 181 is formed on the base material layer 151f. A capacitance electrode 182 and a conductor 183 are formed on the base material layer 151g. A ground conductor 184 is formed on the base material layer 151h.

By laminating the base material layers 151a to 151h, the capacitance element C11 is formed between the capacitance electrodes 181 and 182 and the capacitance element C12 is formed between the capacitance electrode 182 and the ground conductor 184. More specifically, the feeding terminal 141 is connected to the capacitance electrode 181 via a via-hole conductor 165j, and is connected to one end of the conductor 183 via a via-hole conductor 165i. The other end of the conductor 183 is connected to one end of the conductor 161 (the first inductance element L1) via the via-hole conductor 165f, and the other end of the conductor 161 is connected to one end of the conductor 162 (the second inductance element L2) via the via-hole conductor 165b. The other end of the conductor 162 is connected to one end portion of the ground conductor 184 via the via-hole conductor 165c, and the other end portion of the ground conductor 184 is connected to the ground terminal 142 via a via-hole conductor 165k.

The other end of the conductor 164 (the fourth inductance element L4) branched off from the conductor 162 is connected to one end of the conductor 163 (the third inductance element L3) via the via-hole conductor 165d. The other end of the conductor 163 is connected to the antenna terminal 143 via the via-hole conductor 165e. The via-hole conductor 165e is connected to the capacitance electrode 182 on the base material layer 151g.

In the fourth example of the frequency stabilization device 135, the degree of coupling between the primary-side and secondary-side series circuits 36 and 37 can be adjusted with the capacitance value of the capacitance element C11. The resonant frequency of the secondary-side series circuit 37 can be adjusted with the capacitance value of the capacitance element C12. In an exemplary modification illustrated in FIG. 21B, the resonant frequency of the primary-side series circuit 36 can be adjusted with the capacitance value of the capacitance element C13.

Figure 23:
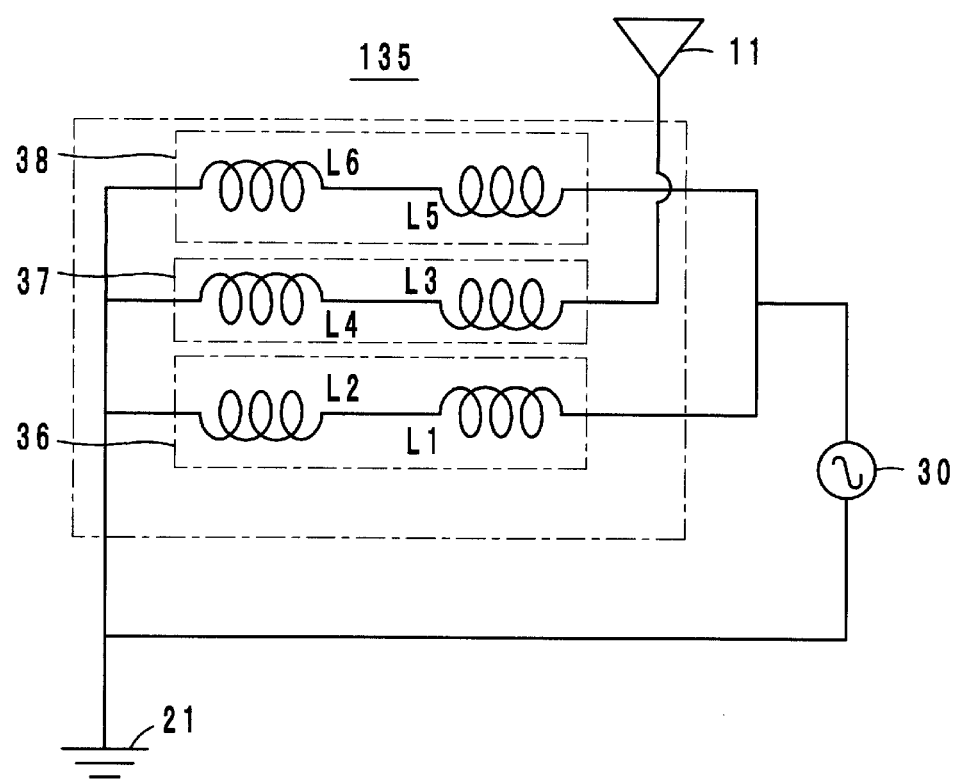
FIG. 23 is an equivalent circuit diagram of an antenna apparatus according to an eighth preferred embodiment of the present invention.

An antenna apparatus according to the eighth preferred embodiment is illustrated in FIG. 23. In a frequency stabilization circuit included in this preferred embodiment, the primary-side series circuit 38 (primary-side reactance circuit) is disposed in addition to the primary-side series circuit 36 and the secondary-side series circuit 37. The fifth and sixth inductance elements L5 and L6 included in the primary-side series circuit 38 are coupled to each other in opposite phases. The fifth and first inductance elements L5 and L1 are coupled to each other in opposite phases. The sixth and second inductance elements L6 and L2 are coupled to each other in opposite phases. One end of the third inductance element L3 is connected to the first radiating element 11, and one end of the fourth inductance element L4 is connected to the second radiating element 21.

Figure 24:
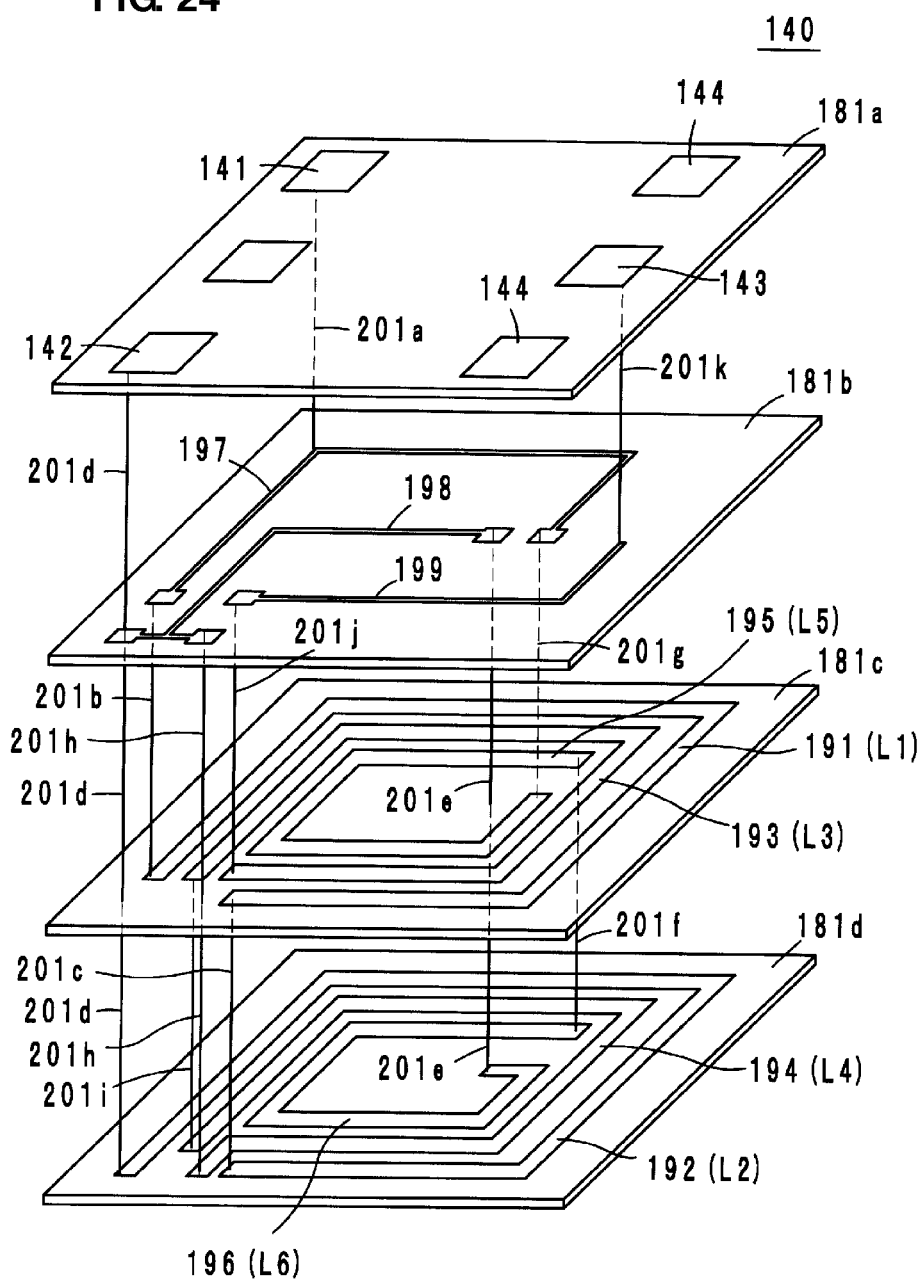
FIG. 24 is an exploded perspective view of a fifth example of a frequency stabilization device.

The frequency stabilization device 135 (a fifth example) will be described with reference to FIG. 24. In the fifth example, the terminals 141, 142, 143, and 144 are disposed on a base material layer 181a that is the first layer, and conductors 197, 198, and 199 are disposed on a base material layer 181b that is the second layer. Conductors 191, 193, and 195 to be the first, third, and fifth inductance elements L1, L3, and L5, respectively, are disposed on a base material layer 181c that is the third layer, and conductors 192, 194, and 196 to be the second, fourth, and sixth inductance elements L2, L4, and L6, respectively, are disposed on a base material layer 181*d* that is the fourth layer. The conductor 193 is sandwiched between the conductors 191 and 195, and the conductor 194 is sandwiched between the conductors 192 and 196.

By laminating the base material layers 181*a* to 181*d*, the conductors 197 to 199 and 191 to 196 and the terminals 141, 142, and 143 are connected via interlayer connection conductors (via-hole conductors), and the equivalent circuit illustrated in FIG. 23 is formed. That is, the feeding terminal 141 is connected to an intermediate portion of the conductor 197 via a via-hole conductor 201*a*, one end of the conductor 197 is connected to one end of the conductor 191 (the first inductance element L1) via a via-hole conductor 201*b*, and the other end of the conductor 191 is connected to one end of the conductor 192 (the second inductance element L2) via a via-hole conductor 201*c*. The other end of the conductor 192 is connected to the ground terminal 142 via a via-hole conductor 201*d*. The via-hole conductor 201*d* is connected to one end of the conductor 198 on the base material layer 181*b*, and the other end of the conductor 198 is connected to one end of the conductor 196 (the sixth inductance element L6) via a via-hole conductor 201*e*. The other end of the conductor 196 is connected to one end of the conductor 195 (the fifth inductance element L5) via a via-hole conductor 201*f*, and the other end of the conductor 195 is connected to the other end of the conductor 197 via a via-hole conductor 201*g*. That is, the other end of the fifth inductance element L5 is connected to the feeding terminal 141 via the via-hole conductor 201*g*, the conductor 197, and the via-hole conductor 201*a*.

On the other hand, the conductor 198 connected to the ground terminal 142 is connected to one end of the conductor 194 (the fourth inductance element L4) via a via-hole conductor 201*h*, and the other end of the conductor 194 is connected to one end of the conductor 193 (the third inductance element L3) via a via-hole conductor 201*i*. The other end of the conductor 193 is connected to one end of the conductor 199 via a via-hole conductor 201*j*, and the other end of the conductor 199 is connected to the antenna terminal 143 via a via-hole conductor 201*k*.

The operation of the eighth preferred embodiment and the fifth example in the form of the laminate 140 is basically the same as that of the first preferred embodiment and the first example. In the eighth preferred embodiment, the secondary-side series circuit 37 is sandwiched between the two primary-side series circuits 36 and 38, so that the degree of coupling between the circuit 36 and each of the circuits 37 and 38 can be increased and the transmission loss of high-frequency signal energy is reduced.

A primary-side series circuit may be sandwiched between two secondary-side series circuits.

Figure 25:
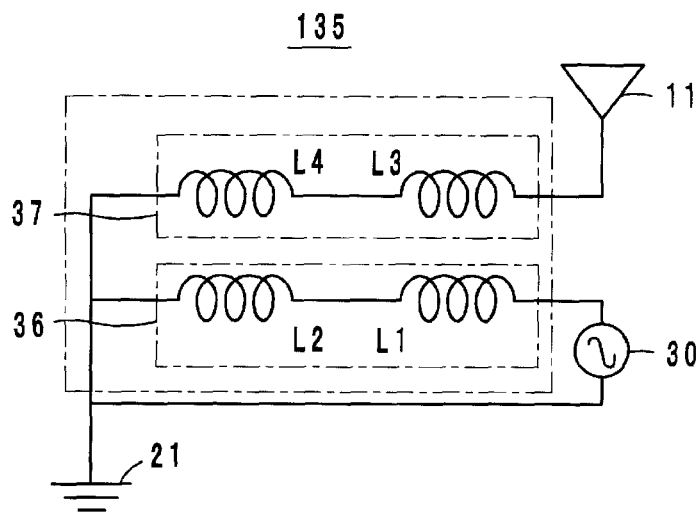
FIG. 25 is an equivalent circuit diagram of an antenna apparatus according to a ninth preferred embodiment of the present invention.

An antenna apparatus according to the ninth preferred embodiment is illustrated in FIG. 25. The frequency stabilization device 135 included in this preferred embodiment preferably is basically the same as the frequency stabilization device according to the first preferred embodiment except that the first and third inductance elements L1 and L3 are coupled to each other in the same phase and the second and fourth inductance elements L2 and L4 are coupled to each other in the same phase. That is, the first and third inductance elements L1 and L3 are coupled mainly via a magnetic field, and the second and fourth inductance elements L2 and L4 are coupled mainly via a magnetic field. Operational effects and advantages according to the ninth preferred embodiment is basically the same as that according to the first preferred embodiment.

Figure 26:
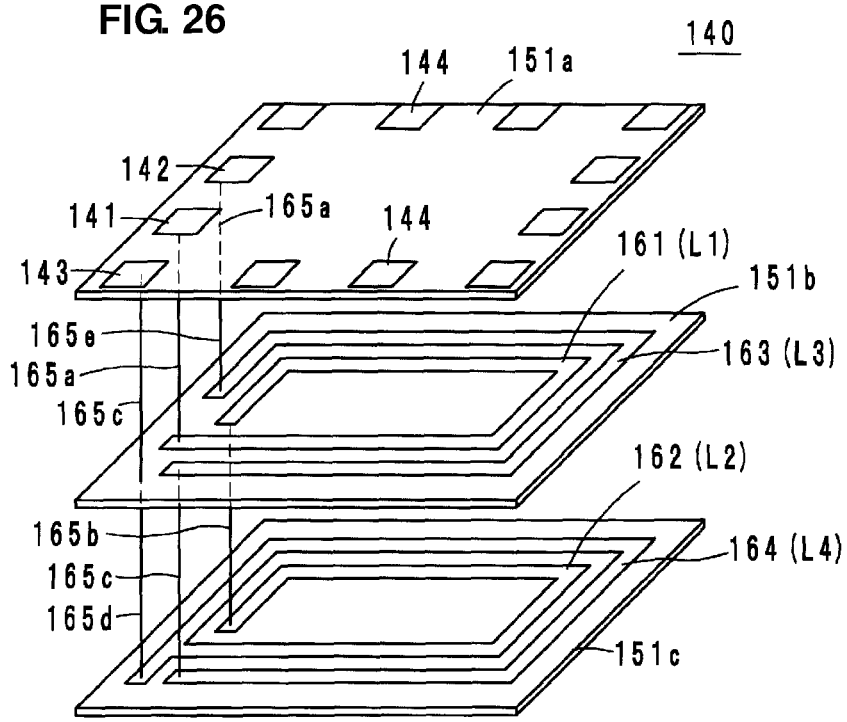
FIG. 26 is an exploded perspective view of a sixth example of a frequency stabilization device.

A sixth example of the frequency stabilization device 135 is illustrated in FIG. 26. The configuration of the sixth example preferably is basically the same as that of the first example illustrated in FIG. 17 except that the conductor 161 (the first inductance element L1) and the conductor 162 (the second inductance element L2) are disposed inside the conductor 163 (the third inductance element L3) and the conductor 164 (the fourth inductance element L4), respectively, and the positions of the feeding terminal 141, the ground terminal 142, and the antenna terminal 143 are changed on the base material layer 151*a*.

Figure 27:
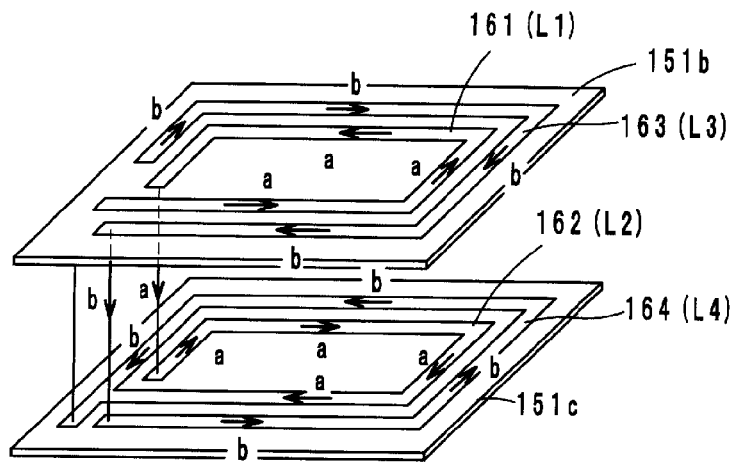
FIG. 27 is a diagram illustrating the operation principle of the sixth example of a frequency stabilization device.

In the sixth example of the frequency stabilization device 135, a high-frequency signal current (a primary current) flows as represented by arrows a in FIG. 27, and an induction current (a secondary current) flows as represented by arrows b in FIG. 27. This point has been described with reference to FIG. 18.

Figure 28A:
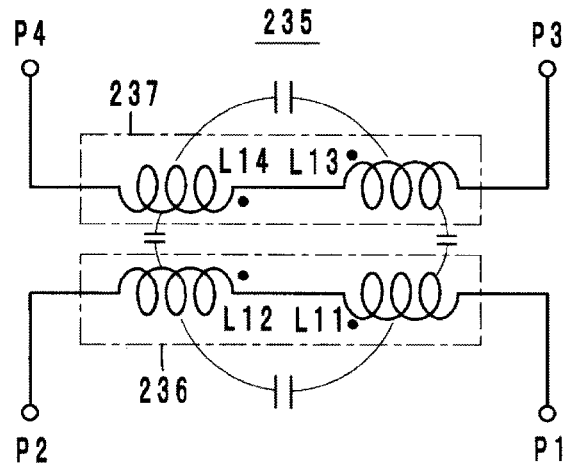

As illustrated in FIG. 28A, an impedance conversion element 235 according to the tenth preferred embodiment includes a primary-side series circuit 236 connected to terminals P1 and P2 and a secondary-side series circuit 237 coupled to the primary-side series circuit 236 via an electric field or a magnetic field. The primary-side series circuit 236 includes a first coil element L11 and a second coil element L12 connected in series to the first coil element L11. The secondary-side series circuit 237 includes a third coil element L13 coupled to the first coil element L11 and a fourth coil element L14 that is connected in series to the third coil element L13 and is coupled to the second coil element L12.

One end of the primary-side series circuit 236 (one end of the first coil element L11) is connected to the terminal P1, and one end of the secondary-side series circuit 237 (one end of the third coil element L13) is connected to a terminal P3. The other end of the primary-side series circuit 236 (the other end of the second coil element L12) is connected to the terminal P2, and the other end of the secondary-side series circuit 237 (the other end of the fourth coil element L14) is connected to a terminal P4.

Figure 28B:
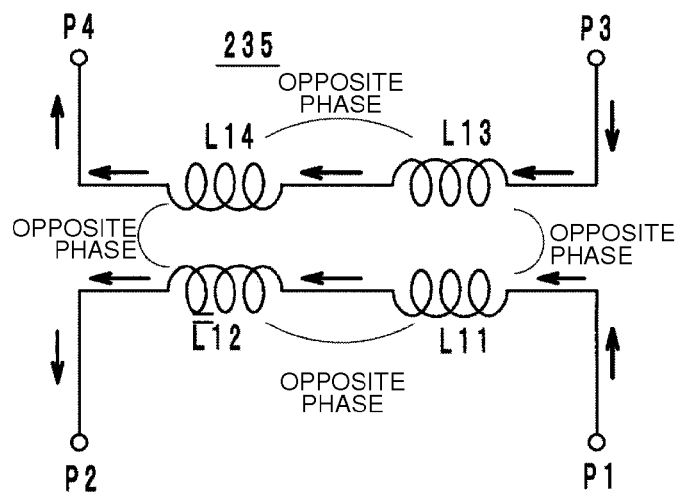

As illustrated in FIG. 28B, the first and second coil elements L11 and L12 are coupled to each other in opposite phases, and the third and fourth coil elements L13 and L14 are coupled to each other in opposite phases. The first and third coil elements L11 and L13 are coupled to each other in opposite phases, and the second and fourth coil elements L12 and L14 are coupled to each other in opposite phases.

In the impedance conversion element 235 having the above-described configuration, a high-frequency signal current that has flowed from the terminal P1 to the primary-side series circuit 236 is led to the first coil element L11, and is led to the third coil element L13 via an induction field as a secondary current when each coil element is defined by a coil pattern. A high-frequency signal current that has been led to the second coil element L12 is led to the fourth coil element L14 via an induction field as a secondary current. As a result, the high-frequency signal current flows in a direction represented by arrows in FIG. 28B.

In the tenth preferred embodiment, the first and second coil elements L11 and L12 operate so that their magnetic fields weaken each other, and the third and fourth coil elements L13 and L14 operate so that their magnetic fields weaken each other. Magnetic fields between the primary-side and secondary-side series circuits 236 and 237 define a closed magnetic circuit. Electromagnetic field coupling occurs so that a current generated by electric field coupling between the first and third coil elements L11 and L13 and a current generated by magnetic field coupling between the first and third coil elements L11 and L13 flow in the same direction. Similarly, electromagnetic field coupling occurs so that a current generated by electric field coupling between the second and fourth coil elements L12 and L14 and a current generated by magnetic field coupling between the second and fourth coil elements L12 and L14 flow in the same direction. The first and second coil elements L11 and L12 are capacitively coupled so that a current flows via an electrode pattern (not illustrated) in the same direction as an illustrated direction of a current. Similarly, the third and fourth coil elements L13 and L14 are capacitively coupled so that a current flows via an electrode pattern (not illustrated) in the same direction as an illustrated direction of a current.

Figure 29:
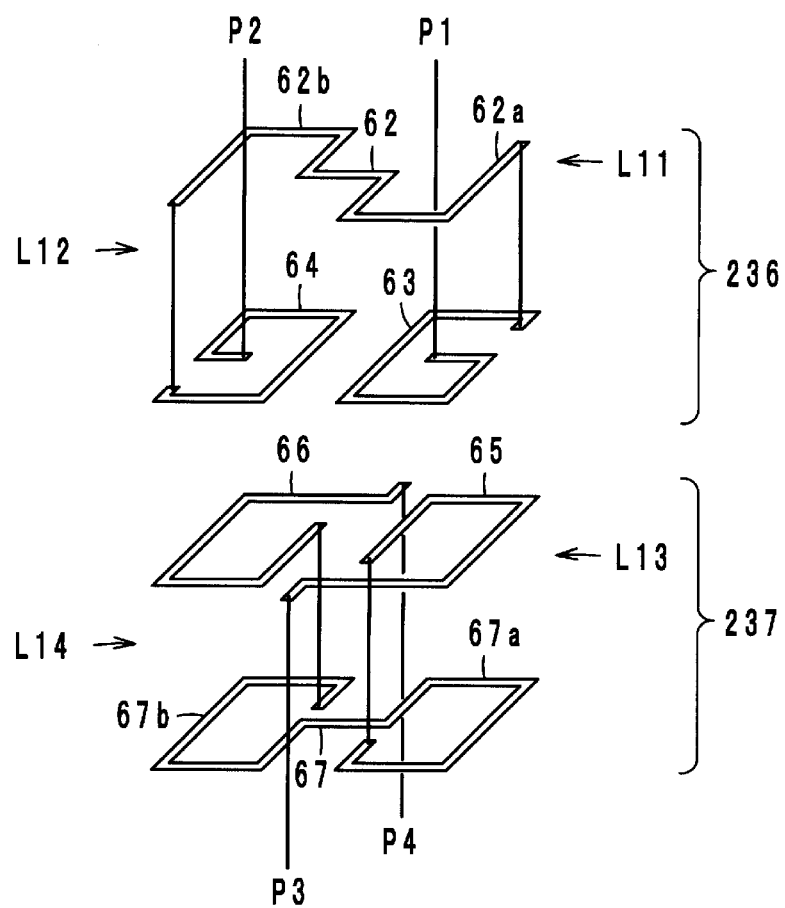
FIG. 29 is a schematic perspective view illustrating the layered structure of an impedance conversion element according to the tenth preferred embodiment of the present invention.

The coil elements L11 to L14 in the impedance conversion element 235 will be described in detail. FIG. 29 illustrates the schematic configuration of the coil elements L11 to L14, and FIG. 32 illustrates the more detailed configuration of the coil elements L11 to L14. First, the detailed configuration will be described with reference to FIGS. 31A, 31B, and 32.

Figure 31A:
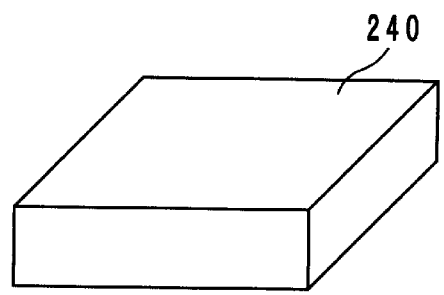
Figure 31B:
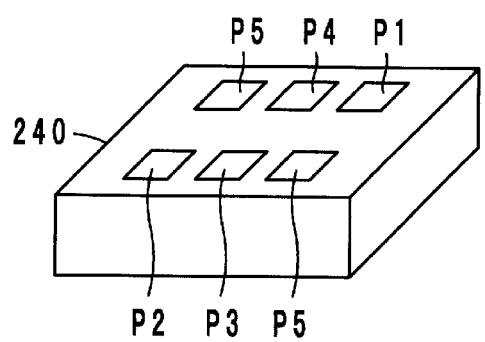
Figure 32:
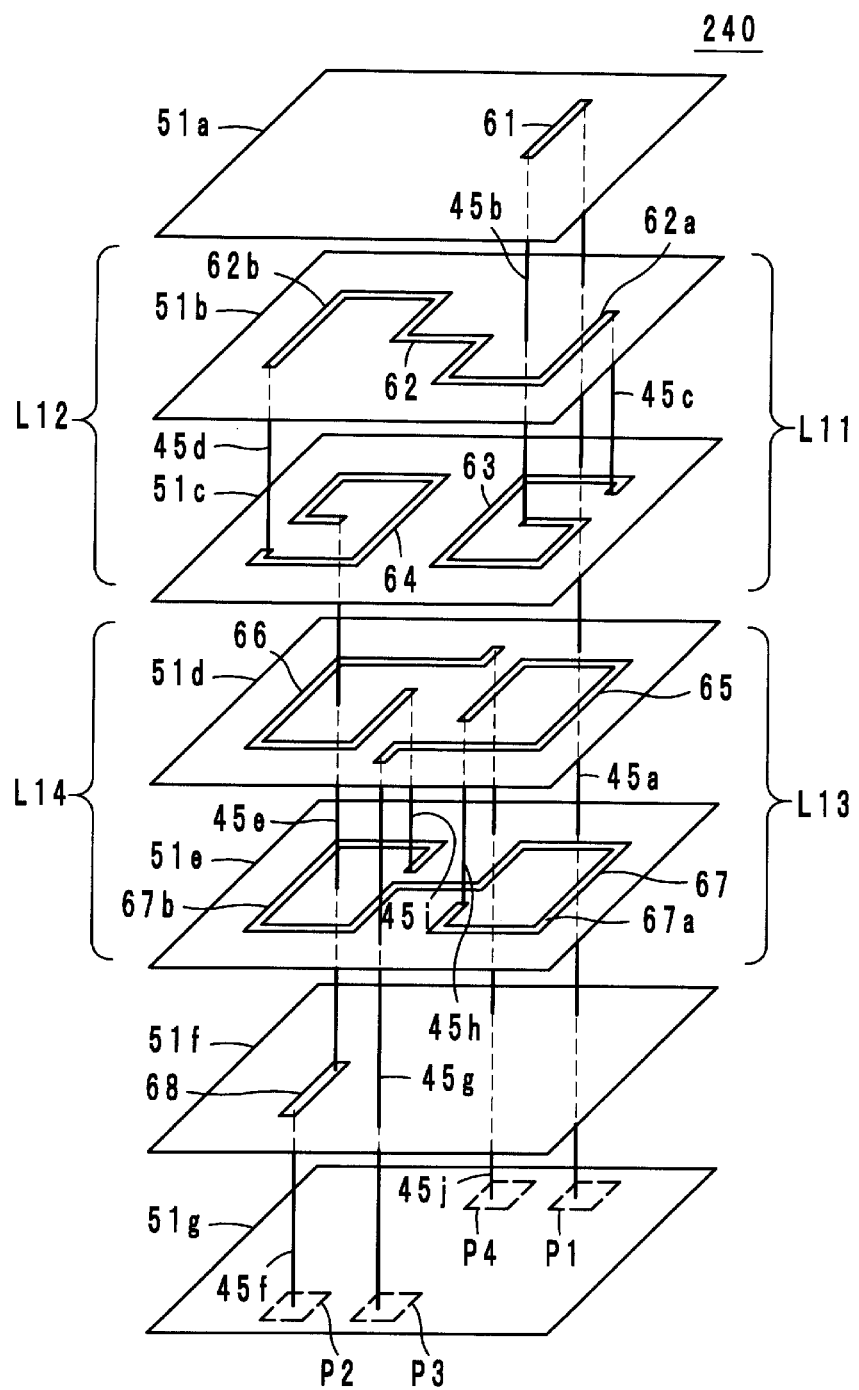
FIG. 32 is an exploded perspective view illustrating the layered structure of an impedance conversion element according to the tenth preferred embodiment of the present invention.

The impedance conversion element 235 can be formed as a chip laminate 240 illustrated in FIGS. 31A and 31B. The laminate 240 is obtained by laminating a plurality of base material layers formed of a dielectric or a magnetic substance, and the terminals P1 to P4 and NC terminals P5 used for mounting are disposed on the undersurface of the laminate 240.

The specific example of the impedance conversion element 235 in the laminate 240 will be described with reference to FIGS. 29 and 32. This specific example has a layered structure that is basically the same as that illustrated in FIG. 5, and the same reference numerals are used to identify elements already described with reference to FIG. 5. That is, the conductor 61 is disposed on the base material layer 51a that is the uppermost layer, the conductor 62 to be the first and second inductance elements L11 and L12 is disposed on the base material layer 51b that is the second layer, and the two conductors 63 and 64 to be the first and second coil elements L11 and L12 are disposed on the base material layer 51c that is the third layer. The two conductors 65 and 66 to be the third and fourth coil elements L13 and L14 are disposed on the base material layer 51d that is the fourth layer, and the conductor 67 to be the third and fourth coil elements L13 and L14 is disposed on the base material layer 51e that is the fifth layer. The ground conductor 68 is disposed on the base material layer 51f that is the sixth layer, and the terminals P1 to P4 are disposed on the undersurface of the base material layer 51g that is the seventh layer. A plain base material layer is laminated on the base material layer 51a that is the uppermost layer.

By laminating the base material layers 51a to 51g, the conductors 61 to 68 and the terminals P1 to P4 are connected via interlayer connection conductors (via-hole conductors), and the equivalent circuit illustrated in FIG. 28A is formed.

That is, the terminal P1 is connected to one end of the coil pattern 63 via the via-hole conductor 45a, the conductor 61, and the via-hole conductor 45b, and the other end of the coil pattern 63 is connected to one end of the coil pattern 62a via the via-hole conductor 45c. The other end of the coil pattern 62a is connected to one end of the coil pattern 62b, and the other end of the coil pattern 62b is connected to one end of the coil pattern 64 via the via-hole conductor 45d. The other end of the coil pattern 64 is connected to the conductor 68 via the via-hole conductor 45e, and the conductor 68 is connected to the terminal P2 via the via-hole conductor 45f. That is, the first coil pattern, i.e., the coil element L11, is defined by the coil patterns and 62a, and the second coil pattern, i.e., the coil element L12, is defined by the coil patterns 62b and 64.

The terminal P3 is connected to one end of the coil pattern 65, and the other end of the coil pattern 65 is connected to one end of the coil pattern 67a via the via-hole conductor 45h. The other end of the coil pattern 67a is connected to one end of the coil pattern 67b, and the other end of the coil pattern 67b is connected to one end of the coil pattern 66 via the via-hole conductor 45i. The other end of the coil pattern 66 is connected to the terminal P4 via the via-hole conductor 45j. That is, the third coil pattern, i.e., the coil element L13, is defined by the coil patterns 65 and 67a, and the fourth coil pattern, i.e., the coil element L14, is defined by the coil patterns 67b and 66.

As illustrated in FIGS. 29 and 32, the first and second coil patterns are adjacent to each other so that the winding axes of the first and second coil patterns are parallel to each other, and the third and fourth coil patterns are adjacent to each other so that the winding axes of the third and fourth coil patterns are parallel or substantially parallel to each other. Furthermore, the first and third coil patterns are disposed so that the winding axes of the first and third coil patterns are on substantially the same line, and the second and fourth coil patterns are disposed so that the winding axes of the second and fourth coil patterns are on substantially the same line.

Each coil pattern is preferably defined by a one-turn loop conductor, but may be defined by a loop conductor having a plurality of turns. The first and third coil patterns may not be disposed so that the winding axes thereof are on exactly the same line, and may be wound so that the coil openings of the first and third coil patterns overlap in plan view, that is, a common magnetic flux passes through these coil patterns. Similarly, the second and fourth coil patterns may not be disposed so that the winding axes thereof are on exactly the same line, and may be wound so that the coil openings of the second and fourth coil patterns overlap in plan view, that is, a common magnetic flux passes through these coil patterns.

As described previously, by disposing the coil elements L11 to L14 in the laminate 240 formed of a dielectric or a magnetic substance, and, in particular, disposing a portion of coupling between the primary-side and secondary-side series circuits 236 and 237 in the laminate 240, the element values of elements included in the impedance conversion element 235 and the degree of coupling between the primary-side and secondary-side series circuits 236 and 237 are not easily affected by an electronic element disposed near the laminate 240.

Figure 30:
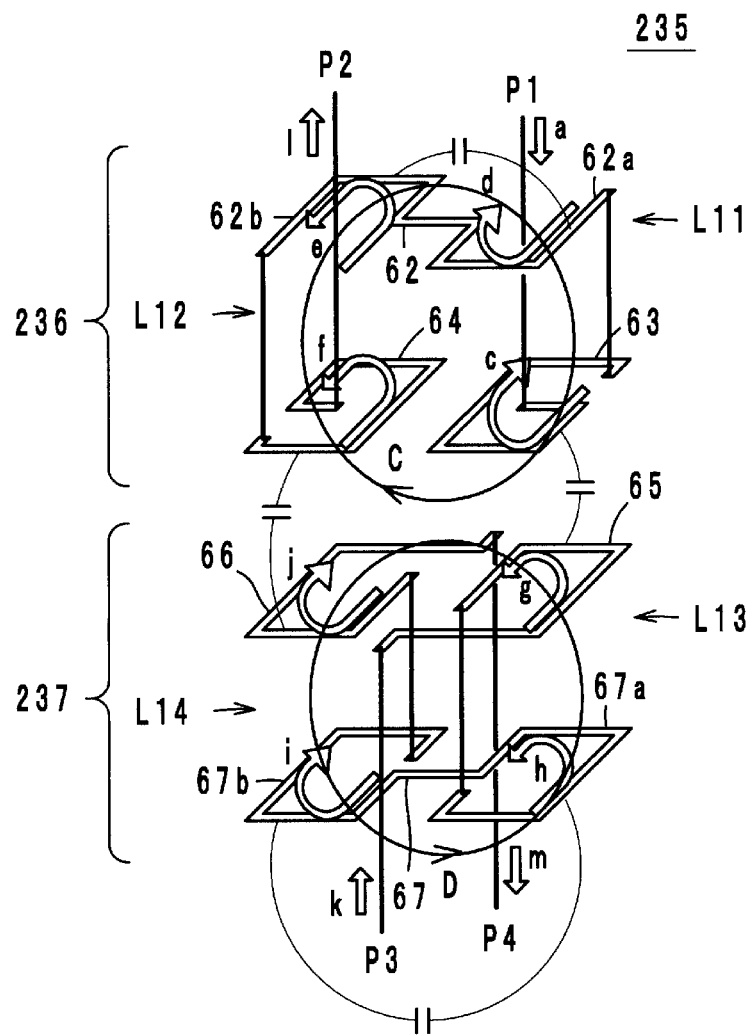
FIG. 30 is an operation principle diagram of an impedance conversion element having the layered structure illustrated in FIG. 29.

In the impedance conversion element 235 according to the tenth preferred embodiment, as illustrated in FIG. 30, a high-frequency current input from the terminal P1 flows as represented by an arrow a, is led to the first coil element L11 (the conductors 62 and 63) as represented by arrows c and d, is led to the second coil element L12 (the conductors 62 and 64) as represented by arrows e and f, and flows from the terminal P2 as represented by an arrow 1. A magnetic field C generated by a primary current (represented by the arrows c and d) excites a high-frequency current at the third coil element L13 (the conductors 65 and 67) as represented by arrows g and h, and an induction current (a secondary current) flows. Similarly, the magnetic field C generated by a primary current (represented by the arrows e and f) excites a high-frequency current at the fourth coil element L14 (the conductors 66 and 67) as represented by arrows i and j, and an induction current (a secondary current) flows. As a result, a high-frequency current represented by an arrow k flows through the terminal P3, and a high-frequency current represented by an arrow m flows through the terminal P4. When the current (represented by the arrow a) flows through the terminal P1 in an opposite direction, the other currents also flow in opposite directions. A displacement current generated by electric field coupling between the first and third coil elements L11 and L13 flows in the same direction as that of the induction current. A displacement current generated by electric field coupling between the second and fourth coil elements L12 and L14 similarly flows in the same direction as that of the induction current. The first and second coil elements L11 and L12 are capacitively coupled via an electrode pattern (not illustrated), and a current flows in the same direction as that of the primary current (represented by the arrows d and e). Similarly, the third and fourth coil elements L13 and L14 are capacitively coupled via an electrode pattern (not illustrated), and a current flows in the same direction as that of the secondary current (represented by the arrows h and i).

The first and second coil elements L11 and L12 are coupled to each other in opposite phases in the primary-side series circuit 236, so that a closed magnetic circuit is defined. The third and fourth inductance elements L3 and L4 are coupled to each other in opposite phases in the secondary-side series circuit 237, so that a closed magnetic circuit is defined. Accordingly, an energy loss caused by impedance matching between the first and second coil elements L11 and L12 and an energy loss caused by impedance matching between the third and fourth coil elements L13 and L14 can be reduced. By setting substantially the same element value as the inductance values of the first and second coil elements L11 and L12 and setting substantially the same element value as the inductance values of the third and fourth coil elements L13 and L14, leakage of a magnetic field in a closed magnetic circuit can be reduced and an energy loss can be further reduced.

The magnetic field C excited by the primary current in the primary-side series circuit 236 and the magnetic field D excited by the secondary current in the secondary-side series circuit 237 cancel each other with an induction current. Using an induction current, an energy loss is reduced and the high degrees of coupling between the first and third coil elements L11 and L13 and coupling between the second and fourth coil elements L12 and L14 are achieved. That is, the primary-side and secondary-side series circuits 236 and 237 are coupled with a high coupling degree.

Figure 33:
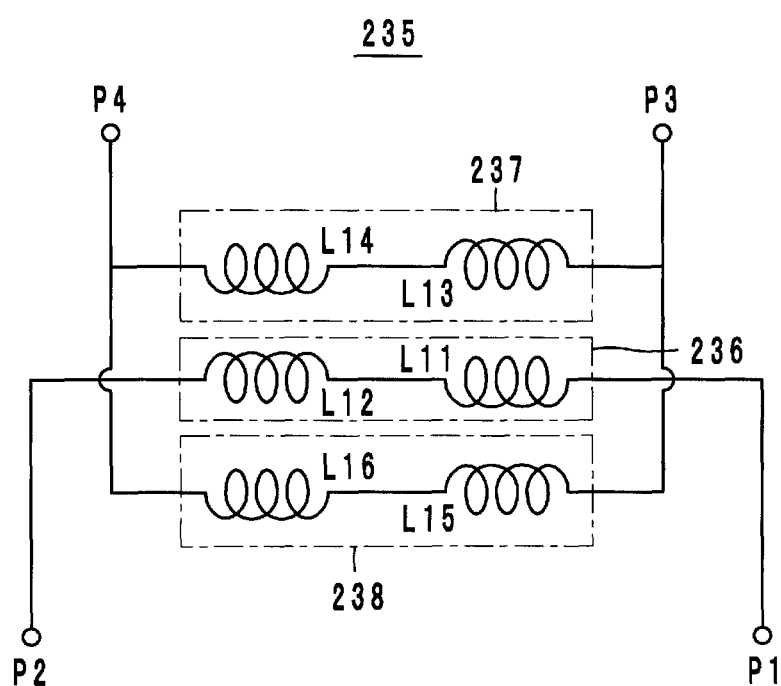
FIG. 33 is an equivalent circuit diagram of an impedance conversion element according to an eleventh preferred embodiment of the present invention.

The impedance conversion element 235 according to the eleventh preferred embodiment is illustrated in FIG. 33. The impedance conversion element 235 includes a secondary-side series circuit 238 in addition to the primary-side series circuit 236 and the secondary-side series circuit 237. A fifth coil element L15 and a sixth coil element L16 included in the secondary-side series circuit 238 are coupled to each other in opposite phases. The fifth and first coil elements L15 and L11 are coupled to each other in opposite phases, and the sixth and second coil elements L16 and L12 are coupled to each other in opposite phases. First ends of the fifth and sixth coil elements L15 and L16 are connected to the terminals P3 and P4, respectively.

Figure 34:
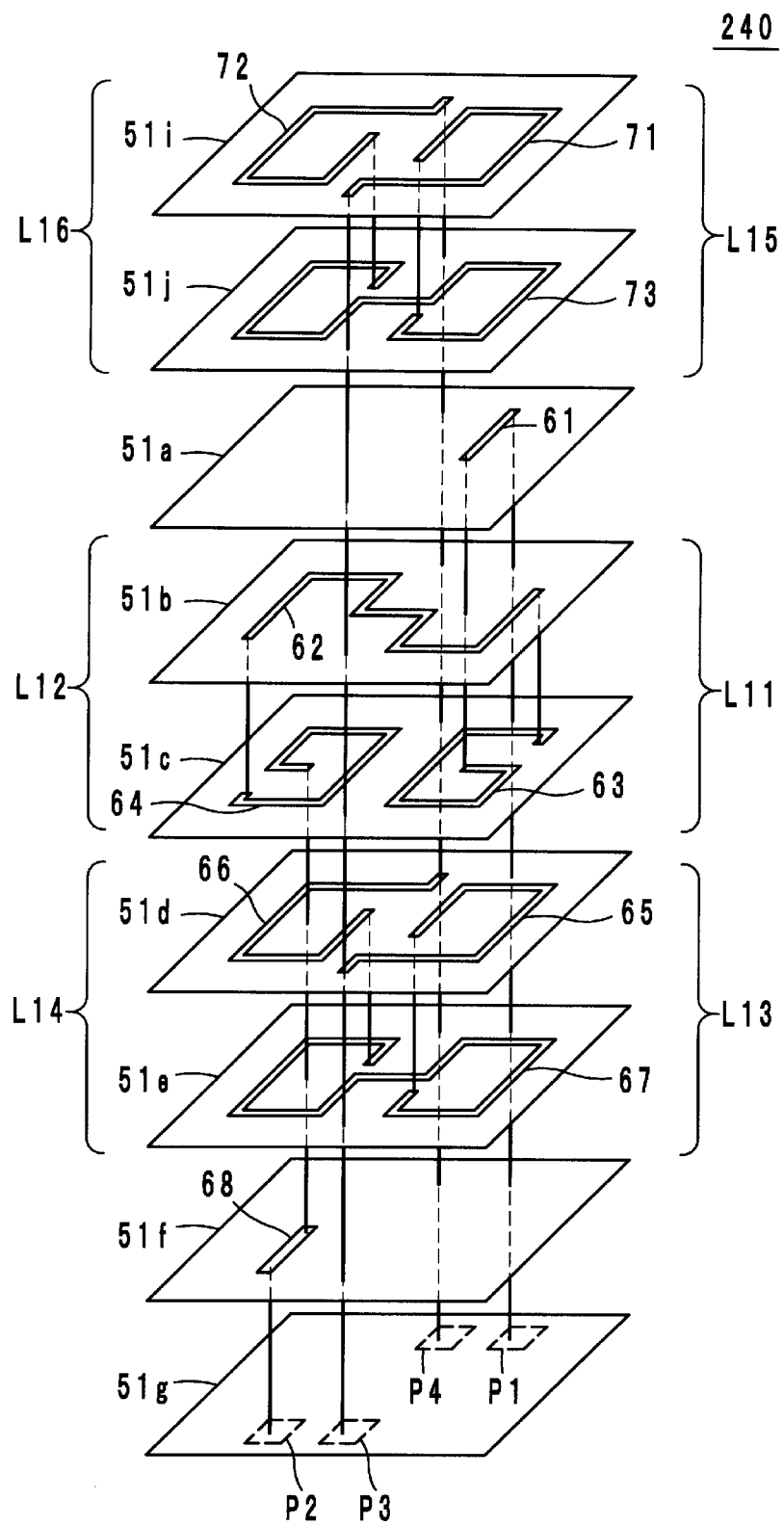
FIG. 34 is an exploded perspective view illustrating the layered structure of an impedance conversion element according to the eleventh preferred embodiment of the present invention.

The specific example of the impedance conversion element 235 formed as the laminate 240 will be described with reference to FIG. 34. In this specific example, on the laminate 240 illustrated in FIG. 32, the base material layers 51*i* and 51*j* on which the conductors 71, 72, and 73 to be the fifth and sixth coil elements L15 and L16 in the secondary-side series circuit 238 are laminated. That is, like the first to fourth coil elements L11 to L14, the fifth and sixth coil elements L15 and L16 are preferably defined by coil patterns and the coil patterns defining the fifth and sixth coil elements L15 and L16 are wound so that magnetic fields generated at the coil elements L15 and L16 define a closed magnetic circuit.

The operation of the eleventh preferred embodiment is basically the same as that of the tenth preferred embodiment. In the eleventh preferred embodiment, the primary-side series circuit 236 is sandwiched between the two secondary-side series circuits 237 and 238, so that the transmission loss of high-frequency current energy from the primary-side series circuit 236 to the secondary-side series circuits 237 and 238 is reduced.

Figure 35:
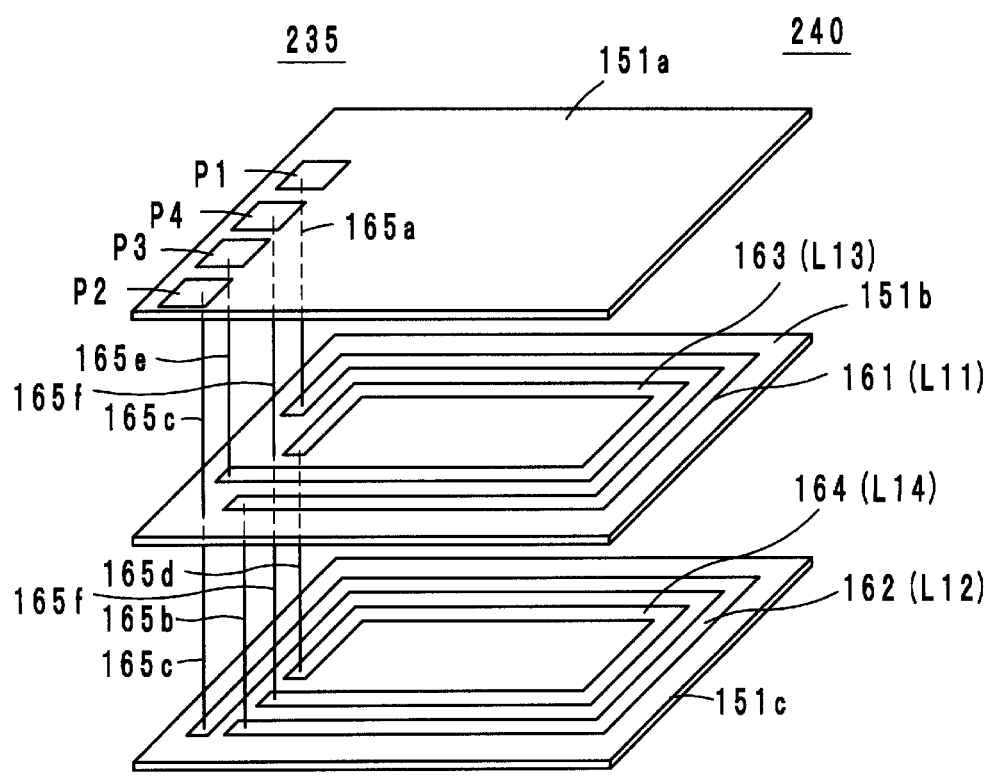
FIG. 35 is an exploded perspective view illustrating the layered structure of an impedance conversion element according to a twelfth preferred embodiment of the present invention.

The impedance conversion element 235 according to the twelfth preferred embodiment is formed as the laminate 240 illustrated in FIG. 35. The laminate 240 is obtained by laminating a plurality of base material layers formed of a dielectric or a magnetic substance. The laminate 240 basically has the same configuration as that of the laminate 140 illustrated in FIG. 17, and the same reference numerals are used to identify elements already described with reference to FIG. 17. That is, the terminals P1 to P4 are disposed on the base material layer 151*a* that is the first layer, the conductors 161 and 163 to be the first and third coil elements L11 and L13, respectively, are disposed on the base material layer 151*b* that is the second layer, and the conductors 162 and 164 to be the second and fourth coil elements L12 and L14, respectively, are disposed on the base material layer 151*c* that is the third layer.

The conductors 161 to 164 can be formed by performing screen printing with paste mainly composed of a conductive material such as silver or copper or etching of a metallic foil. In order to form the base material layers 151*a* to 151*c* with a dielectric, a glass-ceramic material or an epoxy resin material can be used. In order to form the base material layers 151*a* to 151*c* with a magnetic substance, a ferrite ceramic material or a resin material containing ferrite can be used.

By laminating the base material layers 151*a* to 151*c*, the conductors 161 to 164 and the terminals P1 to P4 are connected via interlayer connection conductors (via-hole conductors), and the equivalent circuit illustrated in FIG. 28A is formed. That is, the terminal P1 is connected to one end of the conductor 161 (the first coil element L11) via the via-hole conductor 165*a*, and the other end of the conductor 161 is connected to one end of the conductor 162 (the second coil element L12) via the via-hole conductor 165*b*. The other end of the conductor 162 is connected to the terminal P2 via the via-hole conductor 165*c*. One end of the conductor 163 (the third coil element L3) is connected to the terminal P3 via the via-hole conductor 165*e*, the other end of the conductor 163 is connected to one end of the conductor 164 (the fourth coil element L14) via the via-hole conductor 165*d*, and the other end of the conductor 164 is connected to the terminal P4 via the via-hole conductor 165*f*.

In the twelfth preferred embodiment, the first and third coil elements L11 and L13 are disposed on the same layer (the base material layer 151*b*) in the laminate 240 and the second and fourth coil elements L12 and L14 are disposed on the same layer (the base material layer 151*c*) in the laminate 240, so that the thickness of the laminate 240 is reduced. Since the first and third coil elements L11 and L13 coupled to each other and the second and fourth coil elements L12 and L14 coupled to each other can be formed in the same process (for example, the application of conductive paste), the variations in the coupling degree caused by misalignment between lamination layers is prevented and suppressed, and reliability is improved.

Figure 36:
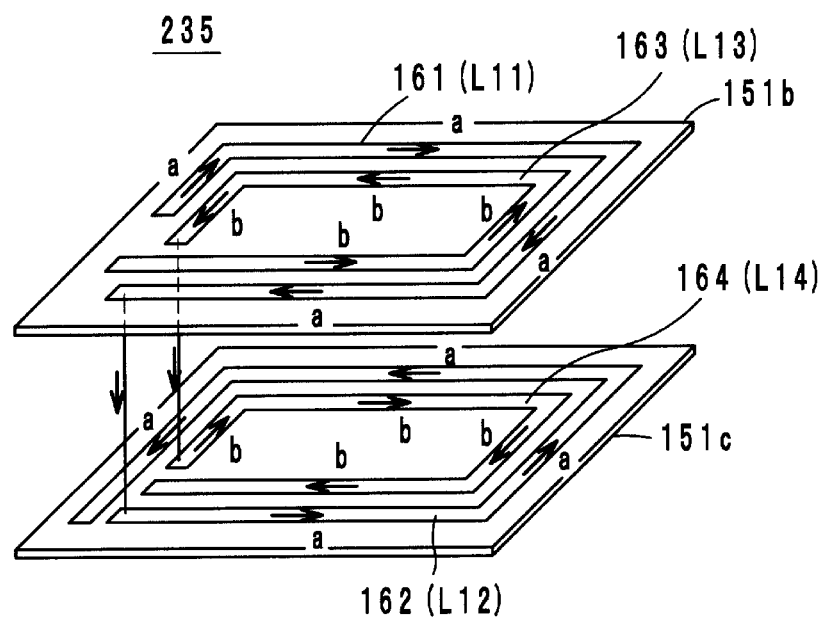
FIG. 36 is an operation principle diagram of an impedance conversion element according to the twelfth preferred embodiment of the present invention.

In the impedance conversion element 235, as illustrated in FIG. 36, a high-frequency current input from the terminal P1 flows through the first and second coil elements L11 and L12 (the conductors 161 and 162) as represented by arrows a. A magnetic field generated by this primary current (represented by the arrows a) excites a high-frequency current represented by arrows b at the third and fourth coil elements L13 and L14 (the conductors 163 and 164), and an induction current (a secondary current) flows. On the other hand, a current flows through the first and second coil elements L11 and L12 (the conductors 161 and 162) in a direction opposite to the direction represented by the arrows a, a current flows through the third and fourth coil elements L13 and L14 (the conductors 163 and 164) in a direction opposite to the direction represented by the arrows b.

The first and second coil elements L11 and L12 are coupled to each other in opposite phases in the primary-side series circuit 236, so that a closed magnetic circuit is defined. The third and fourth coil elements L13 and L14 are coupled to each other in opposite phases in the secondary-side series circuit 237, so that a closed magnetic circuit is defined. Accordingly, an energy loss can be reduced. By setting substantially the same inductance value for the first and second coil elements L11 and L12 and setting substantially the same inductance value for the third and fourth coil elements L13 and L14, leakage of a magnetic field in a closed magnetic circuit can be reduced and an energy loss can be further reduced.

A magnetic field excited by a primary current in the primary-side series circuit 236 and a magnetic field excited by a secondary current in the secondary-side series circuit 237 cancel each other with an induction current. Using an induction current, an energy loss is reduced and the high degrees of coupling between the first and third coil elements L11 and L13 and between the second and fourth coil elements L12 and L14 are achieved. That is, the primary-side and secondary-side series circuits 236 and 237 are coupled with a high coupling degree.

Figure 37:
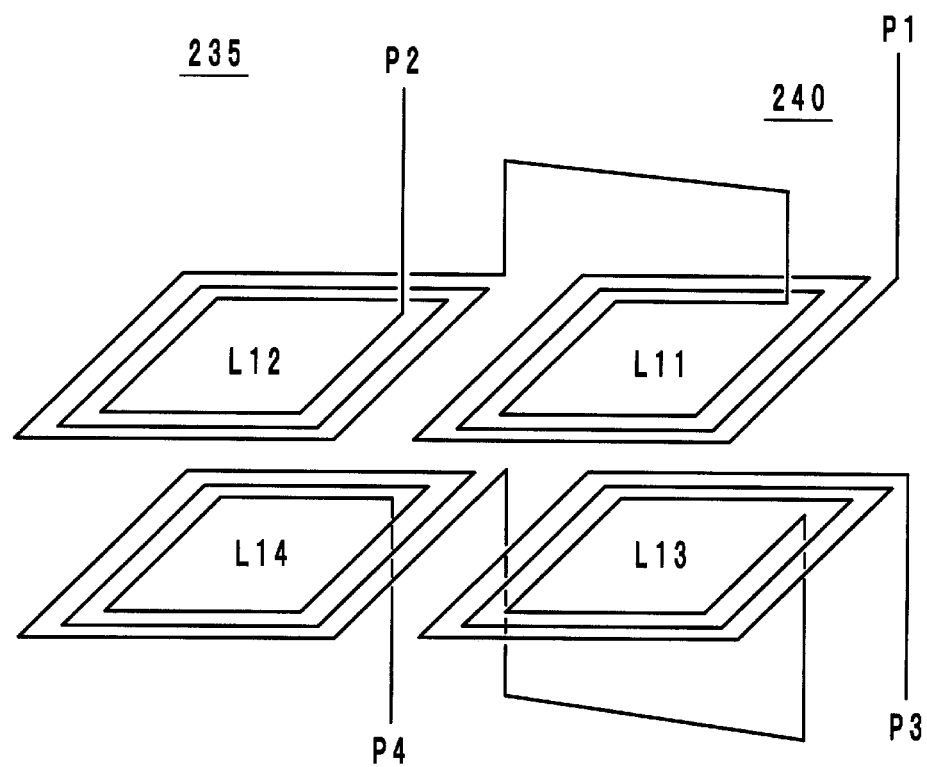
FIG. 37 is an exploded perspective view illustrating the layered structure of an impedance conversion element according to a thirteenth preferred embodiment of the present invention.

As illustrated in FIG. 37, in the impedance conversion element 235 according to the thirteenth preferred embodiment, the first and second coil elements L11 and L12 are adjacent to each other in the same plane and the third and fourth coil elements L13 and L14 are adjacent to each other in the same plane in the laminate 240. Each of the coil elements L11 to L14 has three turns. The winding axes of the first and third coil elements L1 and L13 are on substantially the same line, and the winding axes of the second and fourth coil elements L12 and L14 are on substantially the same line.

An equivalent circuit according to the thirteenth preferred embodiment is similar to that according to the tenth preferred embodiment illustrated in FIG. 28A, and operational effects and advantages of the thirteenth preferred embodiment are also similar to that of the tenth preferred embodiment. In particular, in the thirteenth preferred embodiment, by increasing the numbers of turns of the coil elements L11 to L14, coupling values are improved.

A frequency stabilization circuit, a frequency stabilization device, an antenna apparatus and communication terminal equipment according to the present invention, and an impedance conversion element according to the present invention are not limited to the above-described preferred embodiments, and various changes can be made thereto without departing from the spirit and scope of the present invention.

For example, the present invention can be applied not only to a One-seg or multi-band mobile radio communication system but also to various communication systems including a short-range radio system (using the 2.4 GHz band) such as a Bluetooth or W-LAN system and a GPS system (using the 1.5 GHz band).

Each of the frequency stabilization circuit and the frequency stabilization device can be formed not only as a chip laminate but also as a module such as a strip line integrated with another element and a module mounted on or included in a printed circuit board at which a radiating element is disposed. In each of the frequency stabilization circuit and the frequency stabilization device, a single set of a primary-side series circuit and a secondary-side series circuit is preferably disposed, but a plurality of sets of a primary-side series circuit and a secondary-side series circuit may be disposed. A set of secondary-side series circuits and a primary-side series circuit sandwiched between the secondary-side series circuits described in the second preferred embodiment may be disposed at or in a plurality of stages. By disposing the set at a plurality of stages, the transmission loss of high-frequency signal energy can be reduced and steep attenuation of a return loss can be achieved. The number of coil elements (reactance elements) in a primary-side series circuit or a secondary-side series circuit may be equal to or larger than 3.

When the first and second radiating elements are used as radiating elements, a balanced feeding method is preferably used. When the first and second radiating elements are used as a radiating element and the ground, respectively, an unbalanced feeding method is preferably used.

The impedance conversion element can be used in a step-up/step-down circuit, a transformation/shunt circuit, and a balanced-to-unbalanced transformation circuit. By setting the inductance values of a primary-side series circuit and a secondary-side series circuit as appropriate (for example, in accordance with the number of turns of a loop pattern in a coil element) in the impedance conversion element, an impedance conversion ratio can be arbitrarily set.

As described previously, various preferred embodiments of the present invention are useful for a frequency stabilization circuit, a frequency stabilization device, an antenna apparatus and communication terminal equipment, and an impedance conversion element, and, in particular, has advantages in its suitability for stabilizing the frequency of a high-frequency signal or reducing an input loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A frequency stabilization circuit comprising:
   a primary-side series circuit that includes a first reactance element and a second reactance element connected in series to the first reactance element; and
   a secondary-side series circuit that includes a third reactance element coupled to the first reactance element and a fourth reactance element connected in series to the third reactance element and coupled to the second reactance element; wherein
   a first end of the primary-side series circuit is connected to a feeding circuit, a second end of the primary-side series circuit is connected to a second radiating element, a first end of the secondary-side series circuit is connected to a first radiating element, and a second end of the secondary-side series circuit is connected to the second radiating element.

2. The frequency stabilization circuit according to claim 1, wherein the first and second reactance elements are coupled to each other in a same phase, and the third and fourth reactance elements are coupled to each other in a same phase.

3. The frequency stabilization circuit according to claim 1, wherein the first and third reactance elements are coupled to each other in opposite phases, and the second and fourth reactance elements are coupled to each other in opposite phases.

4. The frequency stabilization circuit according to claim 1, wherein the first and third reactance elements are coupled to each other in a same phase, and the second and fourth reactance elements are coupled to each other in a same phase.

5. The frequency stabilization circuit according to claim 1, wherein the second and fourth reactance elements are connected to the second radiating element.

6. The frequency stabilization circuit according to claim 1, wherein the first, second, third, and fourth reactance elements are first, second, third, and fourth inductance elements, respectively.

7. The frequency stabilization circuit according to claim 6, wherein the first, second, third, and fourth inductance elements include first, second, third, and fourth coil patterns, respectively, each including a loop conductor.

8. The frequency stabilization circuit according to claim 7, wherein the first and second coil patterns are wound so that magnetic fields generated thereby define a closed magnetic circuit, and the third and fourth coil patterns are wound so that magnetic fields generated thereby define a closed magnetic circuit.

9. The frequency stabilization circuit according to claim 7, wherein the first and second coil patterns are adjacent to each other so that winding axes thereof are parallel or substantially parallel to each other, and the third and fourth coil patterns are adjacent to each other so that winding axes thereof are parallel or substantially parallel to each other, and
the first and third coil patterns are disposed so that winding axes thereof are on substantially a same line, and the second and fourth coil patterns are disposed so that winding axes thereof are on substantially a same line.

10. The frequency stabilization circuit according to claim 1, further comprising an element body including a plurality of base material layers made of a dielectric or a magnetic substance laminated on each other to define a laminate, and a portion of coupling between a primary-side circuit and a secondary-side series circuit is included in the laminate.

11. The frequency stabilization circuit according to claim 1, further comprising another secondary-side series circuit that includes a fifth reactance element coupled to the first reactance element and a sixth reactance element connected in series to the fifth reactance element and coupled to the second reactance element, and is connected to the first radiating element.

12. The frequency stabilization circuit according to claim 11, wherein the fifth and sixth reactance elements are fifth and sixth inductance elements, respectively, the fifth and sixth inductance elements include fifth and sixth coil patterns, respectively, each including a loop conductor, and the fifth and sixth coil patterns are wound so that magnetic fields generated thereby define a closed magnetic circuit.

13. An antenna apparatus comprising:
a frequency stabilization circuit; and
a first radiating element; wherein
the frequency stabilization circuit includes:
  a primary-side series circuit that includes a first reactance element and a second reactance element connected in series to the first reactance element; and
  a secondary-side series circuit that includes a third reactance element coupled to the first reactance element and a fourth reactance element connected in series to the third reactance element and coupled to the second reactance element; wherein
a first end of the primary-side series circuit is connected to a feeding circuit, a second end of the primary-side series circuit is connected to a second radiating element, a first end of the secondary-side series circuit is connected to the first radiating element, and a second end of the secondary-side series circuit is connected to the second radiating element.

14. Communication terminal equipment comprising:
a frequency stabilization circuit;
a feeding circuit; and
a first radiating element; wherein
the frequency stabilization circuit includes:
  a primary-side series circuit that includes a first reactance element and a second reactance element connected in series to the first reactance element; and
  a secondary-side series circuit that includes a third reactance element coupled to the first reactance element and a fourth reactance element connected in series to the third reactance element and coupled to the second reactance element; wherein
a first end of the primary-side series circuit is connected to the feeding circuit, a second end of the primary-side series circuit is connected to a second radiating element, a first end of the secondary-side series circuit is connected to the first radiating element, and a second end of the secondary-side series circuit is connected to the second radiating element.

15. A frequency stabilization device comprising:
a laminate including a plurality of dielectric layers or magnetic layers laminated on each other to define a laminate;
a primary-side series circuit that is disposed at or in the laminate, includes a first reactance element and a second reactance element connected in series to the first reactance element; and
a secondary-side series circuit that is disposed at or in the laminate, includes a third reactance element coupled to the first reactance element and a fourth reactance element connected in series to the third reactance element and coupled to the second reactance element; wherein
a first end of the primary-side series circuit is connected to a feeding circuit, a second end of the primary-side series circuit is connected to a second radiating element, a first end of the secondary-side series circuit is connected to a first radiating element, and a second end of the secondary-side series circuit is connected to the second radiating element.

16. The frequency stabilization device according to claim 15, wherein the third and first reactance elements are disposed on a same layer of the laminate, and the fourth and second reactance elements are disposed on a same layer of the laminate.

17. The frequency stabilization device according to claim 15, wherein the first, second, third, and fourth reactance elements are first, second, third, and fourth inductance elements, respectively,
the first, second, third, and fourth inductance elements include first, second, third, and fourth coil patterns, respectively, each including a loop conductor,
the first and second coil patterns are adjacent to each other so that winding axes thereof are parallel or substantially parallel to each other, and the third and fourth coil patterns are adjacent to each other so that winding axes thereof are parallel or substantially parallel to each other; and
the first and third coil patterns are disposed so that winding axes thereof are on substantially a same line, and the second and fourth coil patterns are disposed so that winding axes thereof are on substantially a same line.

18. An impedance conversion element comprising:
a primary-side series circuit including a first coil element and a second coil element connected in series to the first coil element; and
a secondary-side series circuit including a third coil element coupled to the first coil element and a fourth coil element connected in series to the third coil element and coupled to the second coil element; wherein a first end of the primary-side series circuit is connected to a feeding circuit, a second end of the primary-side series circuit is connected to a second radiating element, a first end of the secondary-side series circuit is connected to a first radiating element, and a second end of the secondary-side series circuit is connected to the second radiating element.

19. The impedance conversion element according to claim 18, wherein winding axes of the first and third coil elements are on substantially a same line, and winding axes of the second and fourth coil elements are on substantially a same line.

20. The impedance conversion element according to claim 18, wherein each of the first, second, third, and fourth coil elements includes laminated coil patterns.

21. The impedance conversion element according to claim 18, wherein each of the first, second, third, and fourth coil elements includes a loop conductor that has been wound a plurality of times.

22. The impedance conversion element according to claim 18, further comprising:

a fifth coil element magnetically coupled to the first coil element in an opposite phase; and a sixth coil element that is connected in series to the fifth coil element, is magnetically coupled to the fifth coil element in an opposite phase, and is magnetically coupled to the second coil element in an opposite phase; wherein the first coil element is sandwiched between the third and fifth coil elements, and the second coil element is sandwiched between the fourth and sixth coil elements.

23. The impedance conversion element according to claim 18, wherein the first and second coil elements are adjacent to each other in a same plane, and the third and fourth coil elements are adjacent to each other in a same plane.

24. The impedance conversion element according to claim 18, wherein the first and second coil elements are disposed in different planes, the third and fourth coil elements are disposed in different planes, the first and third coil elements are disposed in a same plane, and the second and fourth coil elements are disposed in a same plane.

25. The impedance conversion element according to claim 18, wherein the first, second, third, and fourth coil elements are integrally arranged in a laminate made of dielectric or a magnetic substance.

* * * * *